United States Patent
Jing et al.

(10) Patent No.: US 10,515,733 B1
(45) Date of Patent: Dec. 24, 2019

(54) BROAD BAND TUNABLE ENERGY ELECTRON BEAM PULSER

(71) Applicant: Euclid Techlabs, LLC, Solon, OH (US)

(72) Inventors: Chunguang Jing, Naperville, IL (US); Jiaqi Qiu, Zhejiang (CN); Ao Liu, Naperville, IL (US); Eric John Montgomery, Oak Park, IL (US); Yubin Zhao, Naperville, IL (US); Wade Rush, Lawrence, KS (US); Roman Kostin, Oak Park, IL (US); Alexei Kanareykin, Bethesda, MD (US)

(73) Assignee: Euclid Techlabs, LLC, Solon, OH (US)

( * ) Notice: Subject to any disclaimer, the term of this patent is extended or adjusted under 35 U.S.C. 154(b) by 0 days.

(21) Appl. No.: 16/393,469

(22) Filed: Apr. 24, 2019

(51) Int. Cl.
*G21K 1/04* (2006.01)

(52) U.S. Cl.
CPC .................. *G21K 1/043* (2013.01)

(58) Field of Classification Search
USPC ...................................... 250/396 R
See application file for complete search history.

(56) References Cited

U.S. PATENT DOCUMENTS

| | | | |
|---|---|---|---|
| 2,940,001 A * | 6/1960 | Post | H05H 9/02 315/5.42 |
| 3,398,375 A * | 8/1968 | Haimson | H05H 7/00 315/505 |
| 3,952,255 A * | 4/1976 | Passow | G21K 1/08 315/505 |
| 4,439,685 A | 3/1984 | Piles | |
| 4,721,909 A | 1/1988 | Richardson | |
| 4,839,520 A | 6/1989 | Garth | |

(Continued)

OTHER PUBLICATIONS

T. Hosokawa, H. Fujioka, and K. Ura, Gigahertsz stroboscopy with the scanning electron microscope, 1978 American Institute of Physics, Rev. Sci. Instrum., 49(9), Sep. 1978, pp. 1293-1299, 7 pages.

(Continued)

*Primary Examiner* — Kiet T Nguyen
(74) *Attorney, Agent, or Firm* — Maine Cernota & Rardin

(57) ABSTRACT

An electromagnetic mechanical pulser implements a transverse wave metallic comb stripline TWMCS kicker having inwardly opposing teeth structured to retard a phase velocity of an RF traveling wave propagated therethrough to match the kinetic velocity of a continuous electron beam simultaneously propagated therethrough. The kicker imposes transverse oscillations onto the beam, which is subsequently chopped into pulses by an aperture. The RF phase velocity is substantially independent of RF frequency and amplitude, thereby enabling independent tuning of the electron pulse widths and repetition rate. The exterior surface of the kicker is conductive, thereby avoiding electron charging. In embodiments, various elements of the kicker and/or aperture can be mechanically varied to provide further tuning of the pulsed electron beam. A divergence suppression section can include a mirror TWMCS and/or magnetic quadrupoles. RF can be applied to a down-selecting TWMCS downstream of the aperture to reduce the pulse repetition rate.

29 Claims, 18 Drawing Sheets

(56) References Cited

U.S. PATENT DOCUMENTS

| | | | |
|---|---|---|---|
| 5,107,124 | A | 4/1992 | Winkler |
| 8,569,712 | B2 | 10/2013 | Knippels et al. |
| 8,710,440 | B2 | 4/2014 | Kiwa |
| 9,048,060 | B2 | 6/2015 | Kieft |
| 9,697,982 | B2 | 7/2017 | Baryshev et al. |
| 2003/0202546 | A1* | 10/2003 | Hartemann ......... G03F 7/70008 372/5 |
| 2005/0006582 | A1 | 1/2005 | Steigerwalk |
| 2005/0226383 | A1* | 10/2005 | Rifkin ................. G02B 5/10 378/119 |
| 2011/0168913 | A1 | 7/2011 | Givon |
| 2011/0216886 | A1* | 9/2011 | Ho ..................... H05H 7/12 378/137 |
| 2014/0103225 | A1 | 4/2014 | Kieft et al. |
| 2016/0293377 | A1 | 10/2016 | Baryshev et al. |
| 2017/0162361 | A1 | 6/2017 | Jing et al. |

OTHER PUBLICATIONS

A. Lassise, P.H.A. Mutsaers, and O.J. Luiten, Compact, low power radio frequency cavity for femtosecond electron, 2012 American Institute of Physics, Rev. Sci. Instrum. 83, 043705 (2012), 10 pgs.
Jiaqi Qiu, Gwanghui Ha, Chunguang Jing, Sergey V. Baryshev, Bryan W. Reed, Junw W. Lau and Yimei Zhu, GHz laser-free time-resolved transmission electron microscopy: A stroboscopic high-duty-cycle method, Ultramicroscopy 161 (2016), pp. 130-136, 6 pgs.

\* cited by examiner

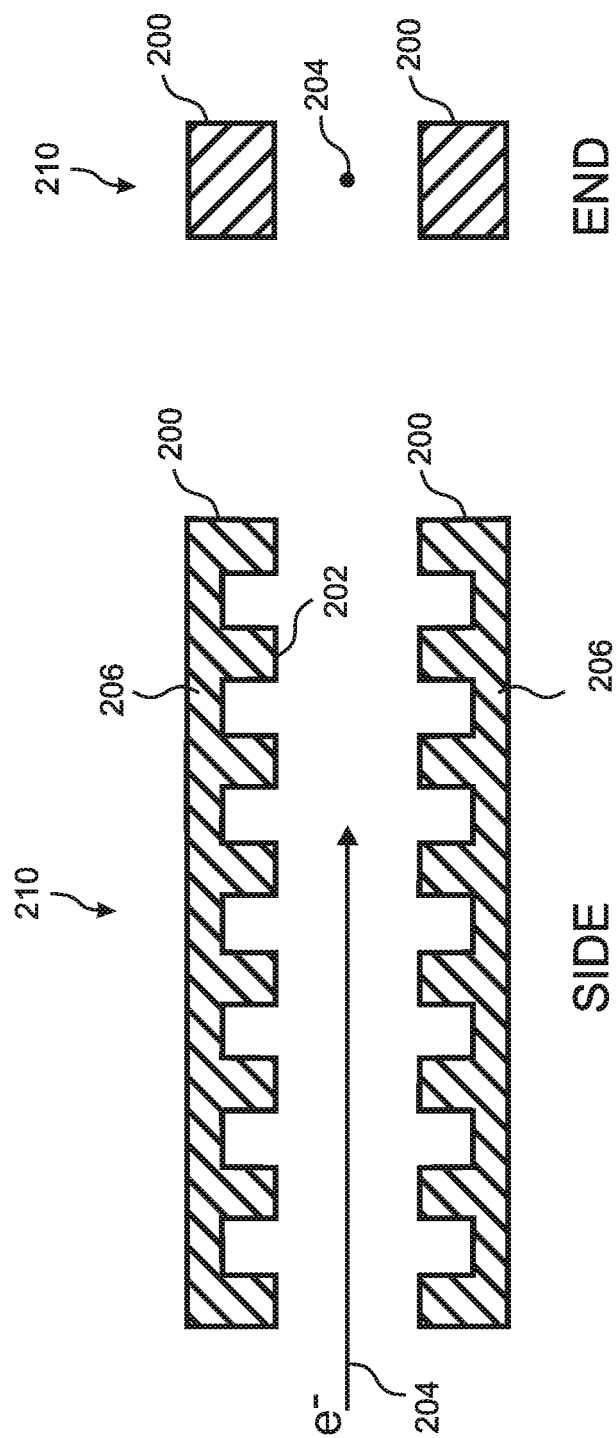

END

SIDE

BROAD BAND TUNABLE ENERGY ELECTRON BEAM PULSER

STATEMENT OF GOVERNMENT INTEREST

Portions of the present invention may have been made in conjunction with Government funding under Department of Energy SBIR Phase IIA Grant #DE-SC0013121, and there may be certain rights to the Government.

RELATED APPLICATIONS

This application is related to U.S. Pat. No. 9,697,982, issued on Jul. 4, 2017, and U.S. patent application Ser. No. 15/368,051 filed Dec. 2, 2016. Both of these applications are herein incorporated by reference in their entirety for all purposes.

FIELD OF THE INVENTION

The invention relates to apparatus and methods for generating pulsed electron beams, and more particularly, to apparatus and methods for generating and controlling low and medium energy pulsed electron beams at very high rates.

BACKGROUND OF THE INVENTION

Generation and precise control of low and medium energy pulsed electron beams is required for many industrial, medical, and research applications, including scanning electron microscopy (SEM), transmission electron microscopy (TEM), and horizontal/vertical accelerator-based beamlines (HAB/VAB), as well as relevant experimental analytical methods that use electron beams in SEM or TEM, or in HAB/VAB as probes.

In research, pulsed electron beams with ultrashort pulse durations are used for investigating dynamic processes in a variety of materials. Frequently, the electron beams are combined with other primary excitation probes such as laser beams or other photon-based probes such as X-ray beams. An example would be the "pump-probe" class of experiments.

One approach for generating electron beam pulses of a specific length and charge (i.e. intensity) in a periodic sequence is to create electron pulses directly on the surface of an electron source (cathode) by exciting the electrons using either a laser or heat combined with an external electric field.

If a laser is used as the excitation method, the sequences of electron pulses are controlled by adjusting the wavelength, power, and/or temporal structure (pulse length and repetition frequency) of the laser photon pulses. For example, if a combination of femtosecond lasers and photocathode electron emitters is used, the electron pulse lengths are strictly determined by the pulse lengths of the fs-laser and the response time of the photocathode. Using this approach, it is possible to routinely obtain pulse lengths as short as 100 femtoseconds ("fs") or less.

However, high repetition rates, defined herein as being repetition rates of at least 1 GHz or higher, are simply not available for laser-excited electron beams, because modern lasers are only capable of repetition rates on the order of 100 MHz or less. For example, the commercially available UTEM (Ultrafast TEM) is a stroboscopic pump-probe method, where the pump and the probe signals are both laser-actuated. Most laser-driven processes, including many processes that are driven electrically, magnetically, or both, can be cycled indefinitely at frequencies above 1 GHz, thus enabling truly in operando microscopy, with the most notable example being switching in a semiconductor device. However, in UTEM, data are repeatedly collected over extended periods of time, and thermal load from the pump laser must be managed so that a process under study is not irreversibly damaged. Therefore, even though lasers with higher repetition rates are available, UTEM systems typically operate at much less than 0.1 GHz, and sometimes even at about 0.1 MHz, depending on the experiment.

In addition, it is often important in experimental systems to provide flexible and simple solutions for switching between continuous and pulsed beam modes. If the combination of a photocathode and an fs-laser is used for pulsed beam generation, then the required continuous beam must be generated using a separate thermionic or field emission source.

On the other hand, if heat combined with an external electric field is used as the excitation method, then the sequences of electron pulses are controlled by the electric field strengths and the temporal structure (pulse length and repetition frequency) of the electric field pulses.

Still another approach for generating pulsed electron beams is to mechanically or electromagnetically block and unblock (i.e. "chop") a continuous electron beam at a desired periodicity, according to the desired electron pulse timing. Typically, a transverse oscillation is imposed onto the beam, and then an aperture is used to chop the oscillating beam into pulses. Approaches that use deflecting cavity technology for chopping electron beams of tens of kV in the GHz frequency range have been known since the 1970's.

According to this approach, a continuous beam of electrons is directed through a device, referred to herein as an electro-magnetic mechanical pulser (EMMP), that operates to chop the beam and collimate the output. The EMMP includes a "kicker" that uses radio frequency energy to impose transverse oscillations onto the beam according to at least one of a time-varying electric field and a time-varying magnetic field generated within the kicker, after which an aperture "chops" the laterally oscillated beam into pulses. The RF is generated in the kicker in a "transverse" mode, meaning that its electric and magnetic field components oscillate transverse to the beam propagation direction. More specifically, the electric and magnetic components of the RF wave propagate in orthogonal planes that contain the long axis of the EMMP along which the electrons propagate.

One possibility for implementing an EMMP kicker is to use a "stripline." As is generally known, in a metallic traveling wave stripline, which in its simplest form comprises two flat metallic parallel slabs, if the medium between two slabs is vacuum or air, then the phase velocity of the RF electromagnetic wave will travel along the stripline at the speed of light. However, for many applications the electrons travel much more slowly. For example, in TEM applications the energy of the electrons is typically in the range of 100 keV to 300 keV, whereby the electron beam speed is around $2.1 \times 10^8$ m/s, which is only about 70% of the speed of light.

In many EMMP applications, it is therefore necessary to limit the interaction time between the RF wave and the electrons, because otherwise the electrons will experience a phase slippage, which will mean that the overall applied kicking force will be greatly reduced or even cancelled. For this reason, among others, current approaches often employ just one single-cell deflecting cavity, and are typically limited to pulse lengths of 1 picosecond ("ps") at best and repetition rates of 1 GHz or less, which cannot be changed or tuned. Furthermore, these approaches are only applicable for generating low energy electron beams having energies of less than 100 kilo-electron Volts ("keV"). Perhaps even more importantly, these approaches typically result in very extensive electron beam quality deterioration in both the transverse direction (beam diameter and divergence) and longitudinal direction (temporal coherence).

An EMMP that implements a transverse deflecting cavity (TDC-EMMP) is disclosed in U.S. Pat. No. 9,697,982, and in an article published in Ultramicroscopy 161 (2016) 130-136, both of which are incorporated by reference herein in their entirety for all purposes. The TDC-EMMP disclosed in these references avoids the problem of phase velocity mismatch by creating a standing electromagnetic wave within the transverse deflecting cavity, rather than a traveling wave, as the mechanism to impose a spatial oscillation onto a continuous input electron beam. This TDC-EMMP approach is able to generate electron beams that can be pulsed at a high duty cycle with pulsing rates greater than 1 GHz and with minimal transverse and longitudinal dispersion. The spatially oscillating beam is then applied to an adjustable Chopping Collimating Aperture ("CCA") so as to break the beam into a series of pulses, after which a dispersion suppressing section comprising a plurality of cavity resonators and/or magnetic quadrupoles is used to suppress temporal and spatial dispersion of the pulsed beam.

FIG. 1A is a conceptual diagram that illustrates the fundamental concepts underlying the TDC-EMMP approach. In the illustrated example, an initially continuous, "DC" electron beam 100 is transversely modulated into a sinusoid 110 as it passes through a vacuum-filled TDC 102 which is operated at a resonant frequency that lies within a range between 1 GHz and 10 GHz. The amplitude of the sinusoid 110 grows as the modulated beam propagates, and then the beam 110 impinges upon a chopping, collimating aperture, or "CCA" 104, having an opening 106 that is adjustable between 10 μm and 200 μm. The CCA "chops" the beam into pulses 108 that emerge from the CCA at an ultrahigh repetition rate that is twice the TDC modulation rate, because the pulses 108 are produced by cutting the sinusoid 110 of the beam modulation on both the up-swing and the down-swing. The aperture opening 106 and the modulating field of the TDC work together to tune the pulse lengths to between 100 fs and 10 ps, resulting in duty cycles of the TDC-EMMP device of less than or equal to 20%.

After the beam 100 has been chopped into pulses 108, if nothing further were done, both the longitudinal and lateral divergence of the stream of pulses 108 would increase. In other words, the pulses would get longer (temporal divergence in the propagation or "z" direction) and would spread out (spatial dispersion in the x and y directions). So as to avoid this, as shown in FIG. 1A, additional components 112, 114 are included in a divergence suppressing section downstream of the CCA 110 that reverses and suppresses this divergence. In the example of FIG. 1A, the divergence suppressing section includes an additional, demodulating, TDC 114, which is identical in design to the modulating TDC 102, as well as a magnetic quadrupole 112. Additional details as to the features and underlying principles of the TDC-EMMP are presented in application Ser. No. 15/091, 639, and in Ultramicroscopy 161 (2016) 130-136.

With reference to FIG. 1B, in a similar implementation the TDC-EMMP 120 includes a first electromagnetic kicker 102, a collimating aperture 112, a first magnetic quadrupole 112, a second "mirror" electromagnetic kicker 114 that functions as a demodulating element, a second magnetic quadrupole 116, and a third magnetic quadrupole 118. The incoming longitudinal DC electron beam 100 is directed along the optical axis (dashed line in FIG. 1B). At the entrance of the TDC-EMMP 120, a transverse sinusoidal momentum is imparted to the DC beam 100 by the electromagnetic field generated by the first beam kicker 102. Since the electromagnetic field oscillates in the transverse direction, its perpendicular electric and magnetic components vary with time, such that the modulation force that is applied to each incoming electron 100 depends on the time at which it arrives in the TDC kicker 102.

The amplitude of the sinusoid grows in the transverse (horizontal in FIG. 1B) direction as the modulated beam propagates along the optical axis 100 (downward in the figure). When the beam reaches the collimating aperture 104, which is placed on the optical axis 100 downstream of the first kicker 102, the slit in the aperture 104 chops the beam 100 and converts it into a pulsed sequence. However, after passing through the aperture the beam will expand, and both the beam size and divergence will increase. As shown in FIG. 1B, the addition of quadrupole magnets 112, 116, 118 and a second "mirror" beam kicker 114 can demodulate the beam 100 and reduce both its emittance growth and energy spread (i.e. both the spatial and temporal coherence of the beam).

According to the TDC-EMMP approach, the pulse length, and therefore the duty cycle of the pulses, can be adjusted by varying the RF amplitude. However, the wavelength of the standing wave within the TDC kicker is fixed by the dimensions of the TDC. Accordingly, the pulsing rate is adjustable only by varying the electron velocity, and cannot be adjusted independently.

Another approach to EMMP electron beam pulsing is to implement a traveling RF wave in a stripline that is configured to reduce the phase velocity of the RF as it propagates through the kicker. U.S. patent application Ser. No. 15/368, 051, included herein by reference in its entirety for all purposes, discloses such an approach, whereby a traveling RF wave is generated in the kicker, but the RF wave is propagated through a dielectric, causing the phase velocity of the RF wave to be slower than the speed of light, and thereby allowing the electron velocity to be matched to the RF phase velocity. More specifically, according to this approach the "kicker" is a Traveling Wave Transmission Stripline (TWTS) that is terminated by an impedance load. In exemplary implementations of this approach, the TWTS kicker is a hollow continuous tube that is dielectric-filled. The electron beam propagates through the hollow center of the tube, while transverse-mode RF waves simultaneously propagate through the tube. As noted above, the dielectric serves to reduce the phase velocity of RF to a sub-light velocity that can be matched to a velocity of the electrons in the beam.

The RF phase velocity in the TWTS kicker is independent of the RF frequency, such that the modulation rate of the beam and the resulting pulse rate can be tuned over a very wide range by adjusting the RF frequency to a desired value. Independently, the amplitude of the electron beam modulation, and thereby the pulse width, and consequently the pulse duty cycle, can be varied by varying the amplitude of the applied RF. In embodiments, the divergence suppressing section according to this approach includes a "mirror" dielectric TWTS that functions to suppress residual transverse oscillation and divergence of the pulsed beam.

The TWTS-EMMP offers advantages of independent, continuous adjustment of the pulse width and duty cycle over an ultra-broad operating bandwidth, and also includes the advantage of fabrication simplicity. In embodiments, this allows the radiation dose rate to be reduced below a damage threshold level of the measurement sample, while maintaining a high pulse repetition rate so as to rapidly accumulate data. Important applications include electron tomography of cellular structures over a wide range of spatial and temporal scales. The TWTS-EMMP can also be advantageous for enabling a high frequency stroboscopic mode in Transmission Electron Microscope (TEM) applications, whereby the dose rate of the TEM can be varied. Low dose rate TEM can be crucial, for example, when examining biological samples that are vulnerable to radiation damage caused by energetic electrons.

It should be noted that the term "duty cycle" is defined herein as being the ratio of the electron beam pulse width divided by the time between successive electron beam pulses. It should further be noted that the term "continuous variation" and derivatives thereof are used herein to refer to parameters that can be adjusted smoothly throughout their defined ranges, without gaps.

While the TWTS-EMMP provides many advantages over previous approaches, under some circumstances the dielectric that is included in the TWTS-EMMP can be subject to "electron charging," whereby the dielectric acquires an electric charge due to impacts by incoming electrons. While this can be alleviated by applying a thin film conductive coating to the dielectric, the application of such a conducting film can result in loss of electromagnetic energy and reduced system efficiency.

What is needed, therefore, is an alternative to the TWTS-EMMP that provides many of the advantages of the TWTS-EMMP, including production of a pulsed electron beam that is independently and continuously tunable over a wide range of pulse repetition rates and pulse duty cycles, but is not subject to electron charging.

SUMMARY OF THE INVENTION

The present invention is an electromagnetic mechanical pulser (EMMP) that implements a novel "Traveling Wave Metallic Comb Stripline" kicker, and is referred to herein as a TWMCS-EMMP. The disclosed TWMCS-EMMP is an alternative to the TWTS-EMMP, and provides most of the advantages of the TWTS-EMMP, including production of a pulsed electron beam that is independently and continuously tunable over a wide range of pulse repetition rates and pulse duty cycles. In addition, the TWMCS-EMMP is not subject to electron charging, because the outer surface of the TWMCS kicker is entirely metallic. In embodiments, the rate of electron pulses produced by the disclosed TWMCS-EMMP system can be continuously adjusted between 100 MHz and 50 GHz, and the electron dosage energy can be also continuously adjusted by tuning the duty cycle of the pulses within a range that, in embodiments, extends at least from 1% to 10%.

Instead of slowing the phase velocity of a traveling RF wave by implementing a dielectric, as in the case of the TWTS kicker, the TWMCS kicker of the present invention employs a pair of opposing metal (or metal-coated) "combs" having RF excitation inputs at one end and, in embodiments, a terminating load, such as a 50 Ohm load, at the opposite end. Similar embodiments include RF inputs at both ends, for example in embodiments where RF at more than one frequency and/or amplitude are applied to the TWMCS.

According to the present invention, the configuration of the kicker, and in particular the widths, spacing, shapes, offsets, and other structural features of the "teeth" of the combs, controls and determines the phase velocity of the RF waves propagating through the kicker in the transverse electromagnetic mode, whereby the phase velocity is substantially independent of the driving RF frequency over a large frequency range. Accordingly, in each implementation of the invention the geometry of the TWMCS kicker is optimized so that the phase velocity of the transverse electromagnetic wave is synchronized with the electron velocity of the incoming electron beam, which in embodiments can be a continuous beam having an electron kinetic energy of between 100 and 300 keV, and in some embodiments between 100 and 500 keV.

Embodiments include aspects of the TWMCS-EMMP that are mechanically adjustable so as to provide further tuning capability to the pulser. In various embodiments, these features can include a CCA having an adjustable aperture, and a TWMCS having combs that are adjustable in their lateral and/or longitudinal offset. Some embodiments include one or more magnetic or electrostatic beam steering features, which can be located for example at the input to the TWMCS kicker, at the output of the CCA, and/or at the output of the TWMCS-EMMP.

Embodiments further include one or more additional apertures that can be located, for example, at the electron beam input to the TWMCS kicker, to provide, for example, additional collimation of the beam. Elements of the CCA and/or of one of the additional apertures (if included) can be electrically isolated from each other, such that the aperture can be used as a beam-position monitor and/or a beam current monitor.

Embodiments of the present invention further include a "mirror" TWMCS in the dispersion suppressing section. Some embodiments further include a "down-selecting" TWMCS downstream of the CCA that can be excited by RF at a second RF frequency F2 that is a sub-harmonic of the excitation frequency F1 of the TWMCS kicker, i.e. F1/F2=an integer. As a result, the down-selecting kicker deflects some of the electron pulses out of the beam so that they are blocked by a down-selecting aperture located downstream of the down-selecting TWMCS, thereby reducing the number of pulses that remain in the beam, such that the pulse widths are narrow, as determined by the TWMCS kicker and CCA, while the pulse repetition rate is slow, as determined by the down-selecting TWMCS.

A first general aspect of the present invention is an ElectroMagnetic Mechanical Pulser ("EMMP") that includes an input configured to accept a continuous input electron beam, a Traveling Wave Metallic Comb Stripline kicker ("TWMCS" kicker) located downstream of the input and having an internal passage through which the electron beam passes, the TWMCS kicker being configured to impose an oscillatory transverse deflection on the electron beam according to at least one of a transverse time-varying electric field and a transverse time-varying magnetic field generated within the TWMCS kicker by a first RF traveling wave propagated through the TWMCS kicker, a Chopping Collimating Aperture ("CCA") located downstream of the TWMCS kicker and configured to block the electron beam when its deflection exceeds a threshold maximum or minimum, thereby chopping the electron beam into a chopped stream of electron pulses having an electron pulse repetition rate and duty cycle, an output configured to allow electron pulses to emerge from the EMMP as an output stream of electron pulses having a pulse repetition rate and a pulse duty cycle, and a vacuum chamber surrounding all elements of the EMMP and configured to provide a vacuum that is sufficient to allow the electron beam to pass through the EMMP without significant attenuation thereof by residual gasses. In particular, the TWMCS kicker includes at least one pair of opposing combs, each of said opposing combs of said pair of combs comprises a strip from which a plurality of substantially identical, equally spaced-apart blocks extend as teeth, the combs of the pair of combs are spaced apart with teeth facing inward such that the internal passage through which the electron beam passes is between the teeth of the pair of combs, the pair of combs includes an RF energy input proximal to a first end thereof and an RF energy output proximal to an opposite, second end thereof, the teeth of the pair of combs are configured to control a phase velocity of a traveling RF wave propagating from the first end to the second end so that it is matched to an electron velocity of the electron beam, and all exposed surfaces of the pair of combs are electrically conductive.

Embodiments further include a dispersion suppressing section downstream of the CCA, the dispersion suppressing section being configured to suppress a residual dispersion of the stream of electron pulses arising from the deflection imposed by the TWMCS kicker. In some of these embodiments, the dispersion suppressing section includes a demodulating mirror TWMCS having an internal passage through which the electron beam passes downstream of the CCA the mirror TWMCS having a physical configuration that causes a phase velocity of a second RF traveling wave propagated through the mirror TWMCS to be matched to a velocity of the electron beam, the mirror TWMCS being configured to demodulate the oscillatory transverse deflection imposed on the electron beam by the TWMCS kicker. In other of these embodiments, the dispersion suppressing section includes at least one magnetic quadrupole.

In any of the above embodiments, the pulse repetition rate of the electron pulses in the output stream can be tunable from 0.1 GHz to 20 GHz.

In any of the above embodiments, a pulse length of the electron pulses in the output stream can be tunable from 100 fs to 10 ps.

In any of the above embodiments, the duty cycle of the electron pulses in the output stream can be tunable from 1% to 10%.

In any of the above embodiments, the pulse repetition rate and the duty cycle of the electron pulses in the output stream can be independently tunable.

In any of the above embodiments, the EMMP can be configured to accept input electron beams having a kinetic energy between 100 and 500 keV.

In any of the above embodiments, the TWMCS kicker can include two pair of opposing combs through which the electron beam simultaneously passes, the two pair of opposing combs being arranged such that a first pair thereof deflects the electron beam in a first deflection plane and a second pair thereof deflects the electrons in a second deflection plane that is orthogonal to the first deflection plane, wherein a line of intersection between the first and second deflection planes lies along the internal passage through which the electron beam passes.

In any of the above embodiments, the EMMP can further comprise a down-selecting TWMCS positioned downstream of the CCA and configured to reduce the pulse repetition rate of the output stream by deflecting some pulses out from the chopped stream of electron pulses that emerges from the CCA.

In any of the above embodiments, the EMMP can further include a down-selecting aperture located downstream of the down-selecting TWMCS.

In any of the above embodiments, at least one of the combs of the pair of combs can be laterally shiftable toward and away from the other of the combs of the pair of combs.

In any of the above embodiments, the RF energy output can be connected to a terminating impedance. In some of these embodiments, the terminating impedance is a 50 Ohm impedance.

In any of the above embodiments, an orientation of at least one of the combs of the pair of combs can be variable in orientation so as to adjust an angle between the pair of combs.

In any of the above embodiments, an aperture size of the CCA can be mechanically adjustable.

In any of the above embodiments, the CCA can include an aperture that is not circular. In some of these embodiments, the CCA includes an elongated aperture having a height thereof that is at least twice as large as a width thereof.

In any of the above embodiments, the EMMP can include an aperture having electrically isolated elements that enable the aperture to function as at least one of a beam position monitor and a beam current monitor.

Any of the above embodiments can further include at least one magnetic or electrostatic beam deflecting element that is configured to adjust a propagating direction of the electron beam.

A second general aspect of the present invention is a method of generating electron pulses. The method includes providing an EMMP according to any of the above embodiments of the first general aspect, causing a continuous electron beam to pass through the TWMCS kicker while applying RF energy to the RF energy input of the TWMCS kicker, said RF energy causing a traveling RF wave to propagate through the TWMCS kicker, said traveling RF wave having a phase velocity that is substantially equal to an electron velocity of the electron beam, thereby imposing a spatial oscillation on the continuous electron beam, causing the spatially oscillating electron beam to impact the CCA, so that the CCA blocks the electron beam when its deflection exceeds a threshold maximum or minimum, thereby chopping the electron beam into a stream of electron pulses having a desired electron pulse repetition rate, adjusting an amplitude of the applied RF energy so as to adjust widths of the electron pulses to be equal to a desired electron pulse width, and adjusting a frequency of the applied RF energy so that it is equal to one half of a desired electron pulse repetition rate.

In any of the above embodiments, the desired electron pulse repetition rate can be between 100 MHz and 50 GHz, and the desired electron pulse width can be in a range 100 fs to 10 ps.

In any of the above embodiments, the specified electron pulse energy can be between 100 keV and 500 keV.

In any of the above embodiments, the TWMCS kicker can include two orthogonal pairs of combs, and the method can further include applying RF energy to a first of the pairs of combs at a first frequency and applying RF energy to a second of the pairs of combs at a second frequency.

In any of the above embodiments the TWMCS kicker can include two orthogonal pairs of combs; the CCA can include an aperture opening having a non-circular shape: and the method can further comprises applying RF energy to a first of the pairs of combs at a first RF amplitude and applying RF energy to a second of the pairs of combs at a second RF amplitude, and varying the electron pulse width by varying a difference between the first and second RF amplitudes.

In any of the above embodiments, the EMMP can further include a down-selecting TWMCS positioned downstream of the CCA, and the method can further include applying RF energy at a first RF frequency F1 to the TWMCS kicker and applying RF energy to the down-selecting TWMCS at a second RF frequency F2, wherein either F1/F2 or F2/F1 is an integer. In some of these embodiments, the EMMP further comprises a down-selecting aperture downstream of the down-selecting TWMCS. And in some of these embodiments, the down selecting aperture includes an opening having a height thereof that is at least twice as large as a width thereof.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 2A is a simplified side view of a TWMCS kicker in an embodiment where the TWMCS includes only one pair of "combs";

FIG. 2B is an end view of the TWMCS of FIG. 2A;

DETAILED DESCRIPTION

The present invention is an electromagnetic mechanical pulser ("EMMP") that implements a novel "Traveling Wave Metallic Comb Stripline" kicker ("TWMCS"), and is referred to herein as a TWMCS-EMMP. The disclosed TWMCS-EMMP is an alternative to the TWTS-EMMP, and provides most of the advantages of the TWTS-EMMP, including production of a pulsed electron beam that is independently and continuously tunable over a wide range of pulse repetition rates and pulse duty cycles. In addition, the TWMCS is not subject to electron charging because the outer surface of the TWMCS is entirely metallic. In embodiments, the rate of electron pulses produced by the disclosed TWMCS-EMMP system can be continuously adjusted between 100 MHz and 50 GHz, and the electron dosage energy can be independently, continuously adjusted by tuning the amplitude of the RF, and thereby the duty cycle of the pulses, within a range that, in embodiments, extends at least from 1% to 10%.

Figure 2D:
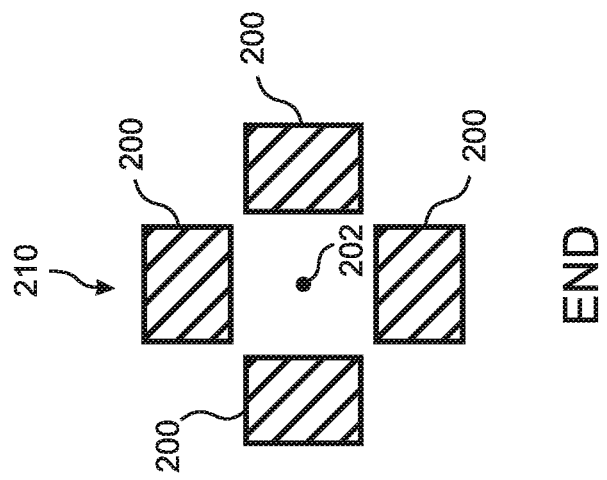
FIG. 2D is an end view of the TWMCS of FIG. 2C.
Figure 2C:
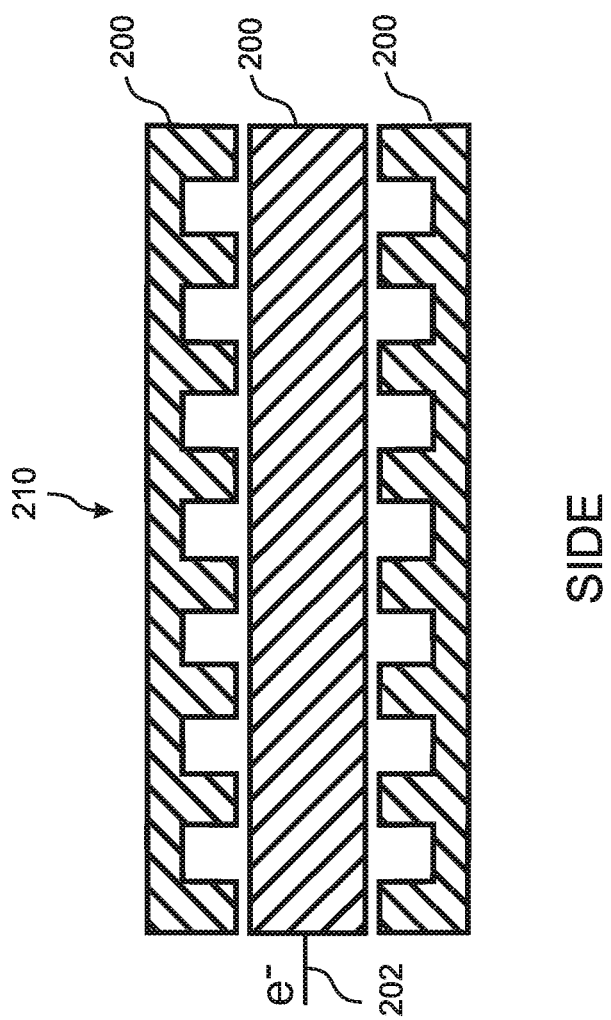
FIG. 2C is a simplified side view of a TWMCS kicker in an embodiment where the TWMCS includes two pair of "combs"

With reference to FIGS. 2A through 2D, the TWMCS 210 includes at least one pair of opposing combs 200 (FIGS. 2A and 2B), and in embodiments two orthogonal pair of opposing combs 200 (FIGS. 2C and 2D). As can be seen in the figures, each comb 200 of the opposing pair of combs comprises a strip 206 from which a plurality of substantially identical, equally spaced-apart blocks extend inward as teeth 202, such that the internal passage through which the electron beam 204 passes is between the combs 200 of the pair of combs 200. At least the exposed surfaces of the combs 200 are metallic. In the embodiments of FIGS. 2A through 2D, the combs are all parallel to each other, and the teeth of opposing combs are aligned with each other. In other embodiments, the combs are not parallel to each other, and/or the teeth are misaligned, so as to excite desired electromagnetic wave modes and implement desired beam modulations. In various embodiments, the teeth 202 and/or strip 206 are not square in cross section, but are shaped and/or angled in either or both of the longitudinal and transverse direction according to the requirements of the application.

Figure 2E:
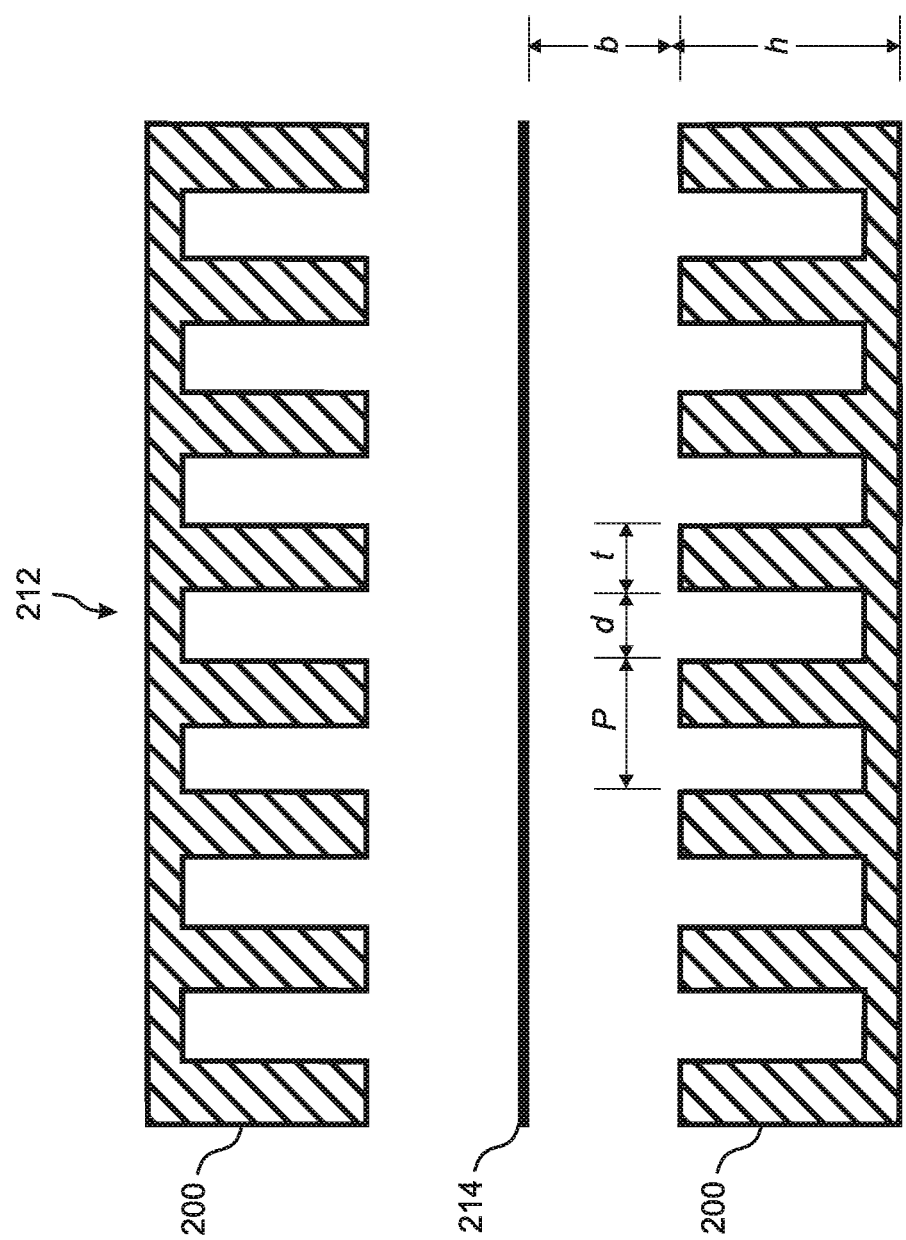
FIG. 2E is a side view of an equivalent model of the TWMCS of FIG. 2A that is the basis of Eqn. 1.

According to the present invention, as electromagnetic traveling waves (not shown) propagate longitudinally through the kicker 210 along and between the combs 200, the phase velocity is slowed by the teeth 202. With reference to FIG. 2E, for any given electron beam 204 input kinetic energy within a wide range, which in embodiments can be between 100 and 300 keV, a TWMCS kicker 210 can be prepared having a configuration of the width t, spacing d, repetition interval P, and height h of the teeth 202 such that the phase velocity of the electromagnetic traveling waves that are propagated through the TWMCS 210 will be synchronized with the non-relativistic speed of the electrons in the beam 204.

Taking the simple example of FIG. 2E, and assuming that the TWMCS kicker 210 is driven by a differential RF signal, i.e. that the two combs 200 of the TWMCS 210 are driven by an RF signal having the same amplitude but out of phase by 180 degrees, then the RF propagation of the embodiment of FIG. 2A will be equivalent to the physical model, i.e. equivalent structure that is illustrated in FIG. 2E, wherein a hypothetical, infinitely thin conducting plane 214 has been inserted in the center between the combs 200 of the TWMCS 212.

Figure 2F:
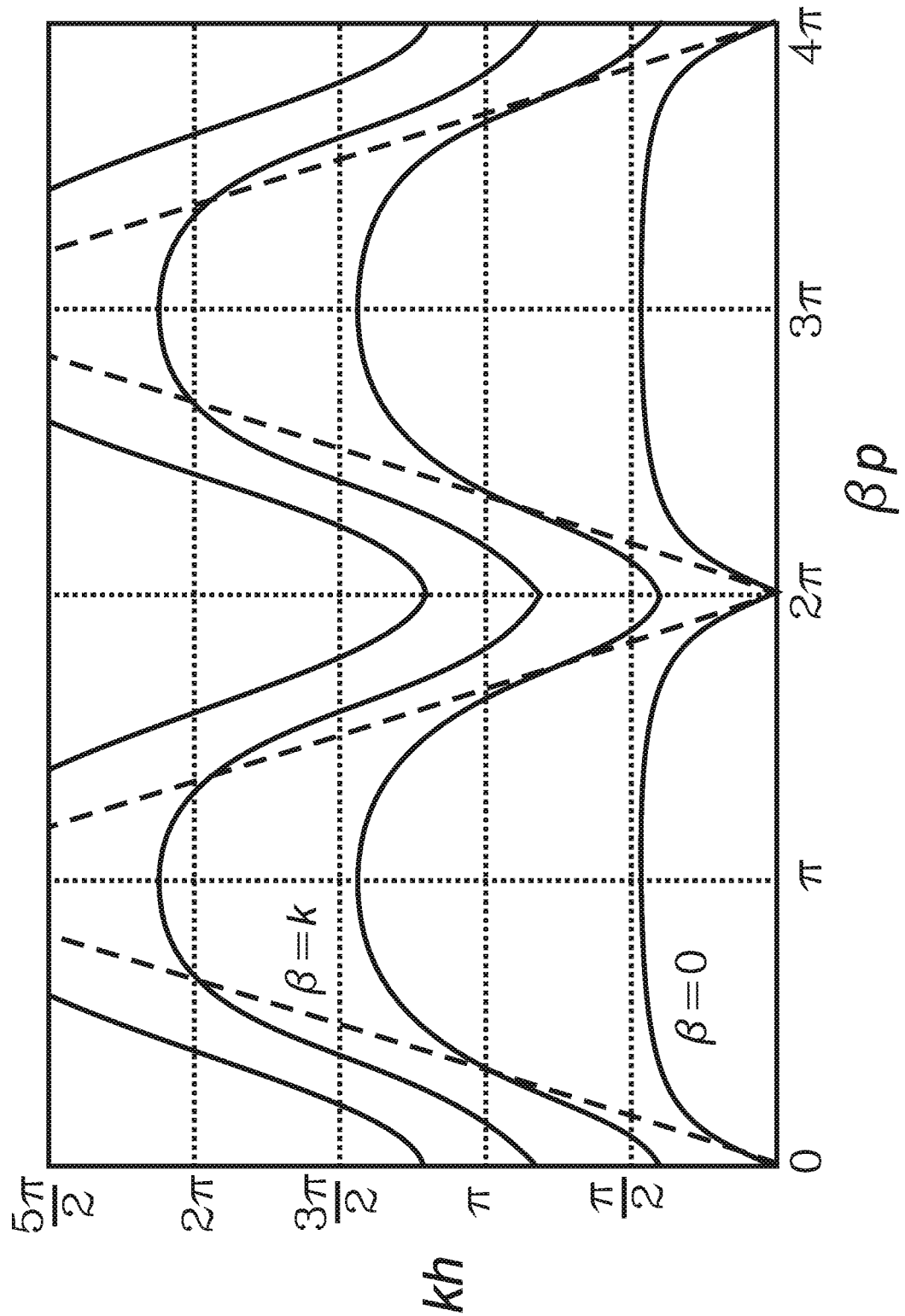
FIG. 2F is a graph that presents a family of dispersion curves derived from Eqn. 1.

According to the equivalent structure of FIG. 2E, the dispersion relation is then given by $$\frac{d}{P}\sum_{n=-\infty}^{\infty}\left\{\frac{1}{\tau_n h \tan(\tau_n b)}\left(\text{sinc}\frac{\beta_n d}{2}\right)^2\right\} = \frac{1}{kh \tan(kh)} \quad (1)$$

where k is the wavenumber of the RF, $\tau_n$ and $\beta_n$ are the order of propagation constants in the x (lateral) and z (longitudinal) direction, respectively, and the other variables are as defined in FIG. 2E. Equation 1 can be used to numerically calculate a family of dispersion relationship curves, such as is illustrated in FIG. 2F, whereby appropriate values of d, t, b, and h can be selected so as to match the phase velocity of the RF with the kinetic velocity of the electrons. Embodiments implement the lowest mode, $\beta=0$, as illustrated by the bottom curve of the figure, in which neither the electric field nor the magnetic field has any component in the wave propagation direction z. This mode is ideal because it ensures that kinetic energy of the electrons will not be affected as they traverse through the TWMCS kicker 210. A more complete field analysis of the embodiment of FIG. 2E can be found in Keqian Zhang and Dejie Li, *Electromagnetic Theory for Microwaves and Optoelectronics*, 2$^{nd}$ Edition, ISBN 978-3-540-74295-1 Springer Berlin Heidelberg New York, Chapter 7, which is incorporated herein by reference in its entirety for all purposes.

The action of the TWMCS kicker 210 on the electrons is therefore similar to a TWTS kicker, but without the use of dielectric materials, and therefore without electron charging of the kicker.

Figure 3A:
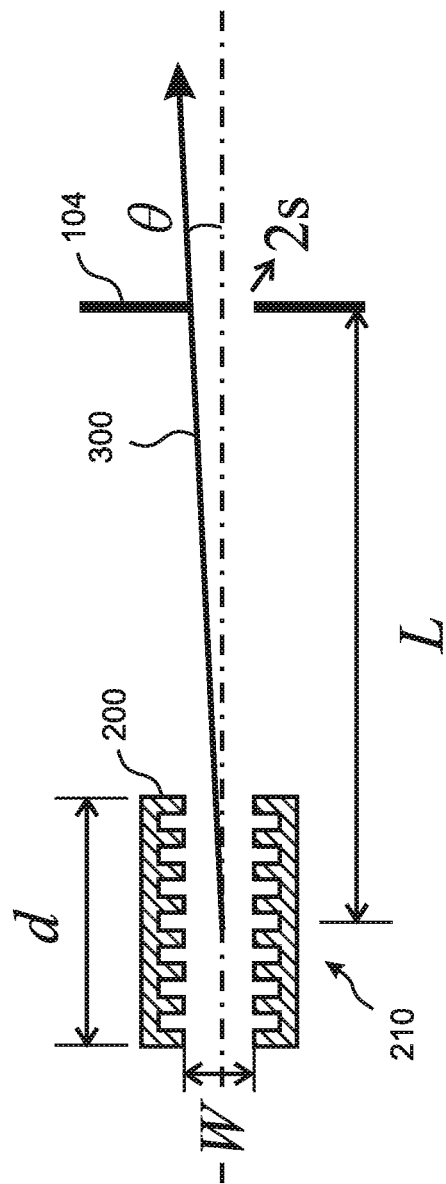
FIG. 3A is a conceptual diagram that illustrates the deflection of an electron beam by a TWMCS and chopping of the beam by a CCA.
Figure 3B:
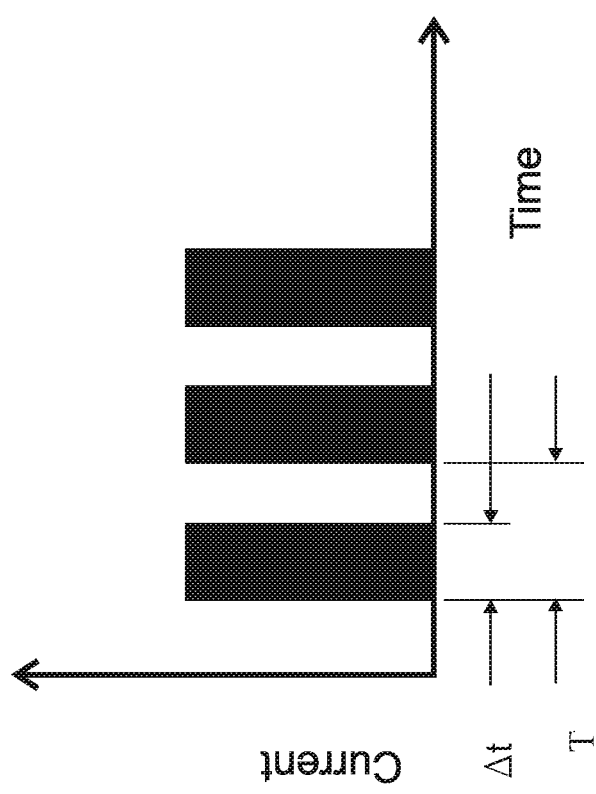
FIG. 3B is a simple diagram illustrating the definition of the duty cycle of the pulsed electron beam.

FIG. 3A is a simplified model of a TWMCS-EMMP in an embodiment of the present invention that illustrates how the incoming continuous electron beam 100 is converted into a beam 300 of electron pulses. As each electron passes through the TWMCS kicker 200, it is deflected by a kicking angle $\theta_k$. After traveling a distance L to the aperture 104, if $\theta_k<\theta$ ($\theta$ being indicated in the figure), the electron passes through the aperture 104. Otherwise, it is blocked by the aperture 104. Therefore, only a fraction of the electrons pass through the aperture 104, and as such the average current of the emerging pulsed electron beam is a fraction of the incoming DC current, as determined by the duty cycle ($D=\Delta t/T$, as illustrated in FIG. 3B).

With reference to tunneling electron microscope (TEM) applications of the present invention, a typical TEM bio-sample grid has a mesh of between 200 and 400. A 200-mesh, for example, has a mesh size of 127 µm. Assuming that the electrons are focused through a single mesh hole that is roughly $1.6 \times 10^4$ square microns, and if it is assumed that the dose rate for bio-samples is required to be less than 10 electrons per square Angstrom per second, then the low-dose-rate limit in that case will be $1.6 \times 10^{13}$ electrons per second, i.e. 2.5 micro-Amperes of average pulsed beam current. For embodiments of the TWMCS-EMMP of the present invention, the duty cycle is variable between 1% and 10%, with continuously tunable pulse rates between 100 MHz and 10 GHz, which means that embodiments can provide a continuously variable beam current of 0.25 to 2.5 µA (i.e. between one and ten electrons per square Angstrom per second). In various applications to TEM, the independent control of the electron pulse width and duty cycle, and of the intensity of the incoming electron beam, that is provided by the present invention can be used to study the effect of two or more different low-dose-rate regimes, even when the total radiation dose rate is the same, i.e. fewer electrons per pulse at a higher repetition rate, vs more electrons per pulse at a lower repetition rate.

Figure 1A:
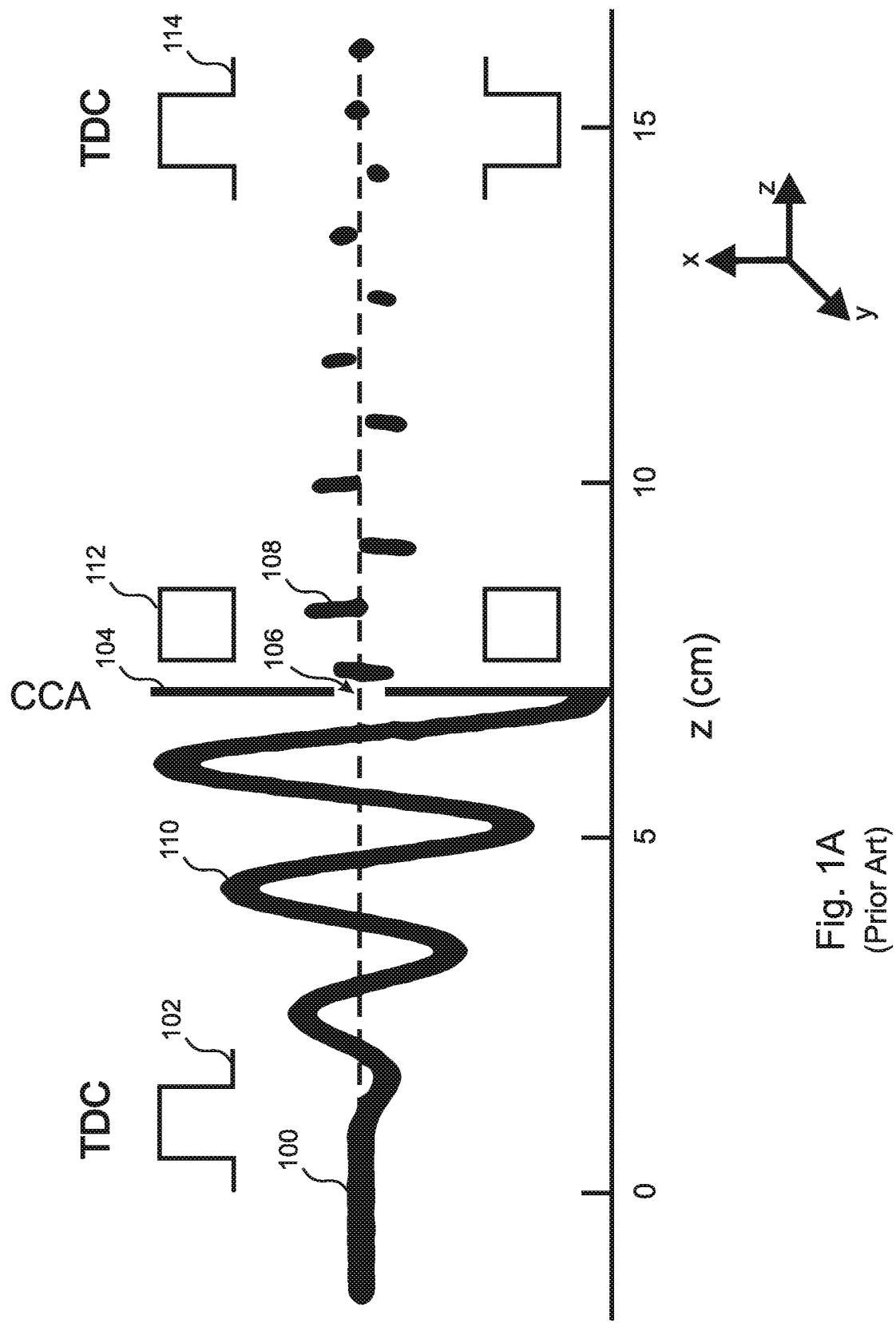
FIG. 1A is a conceptual diagram that illustrates the fundamental concepts underlying the TDC-EMMP approach of the prior art.
Figure 1B:
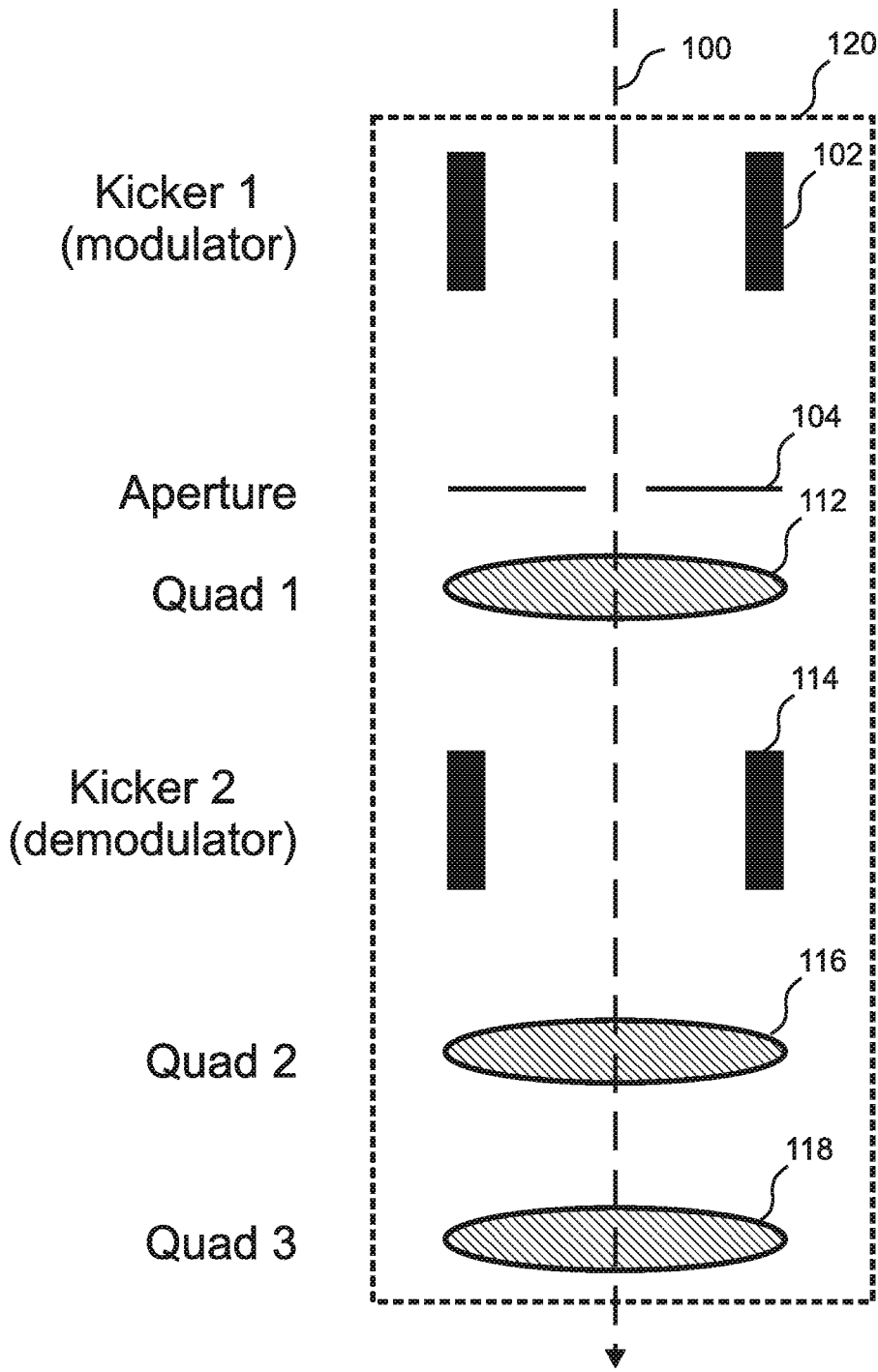
FIG. 1B is a conceptual diagram that depicts an EMMP system according to the Prior Art that includes a demodulating section comprising a demodulating kicker and three magnetic quadrupoles.
Figure 4:
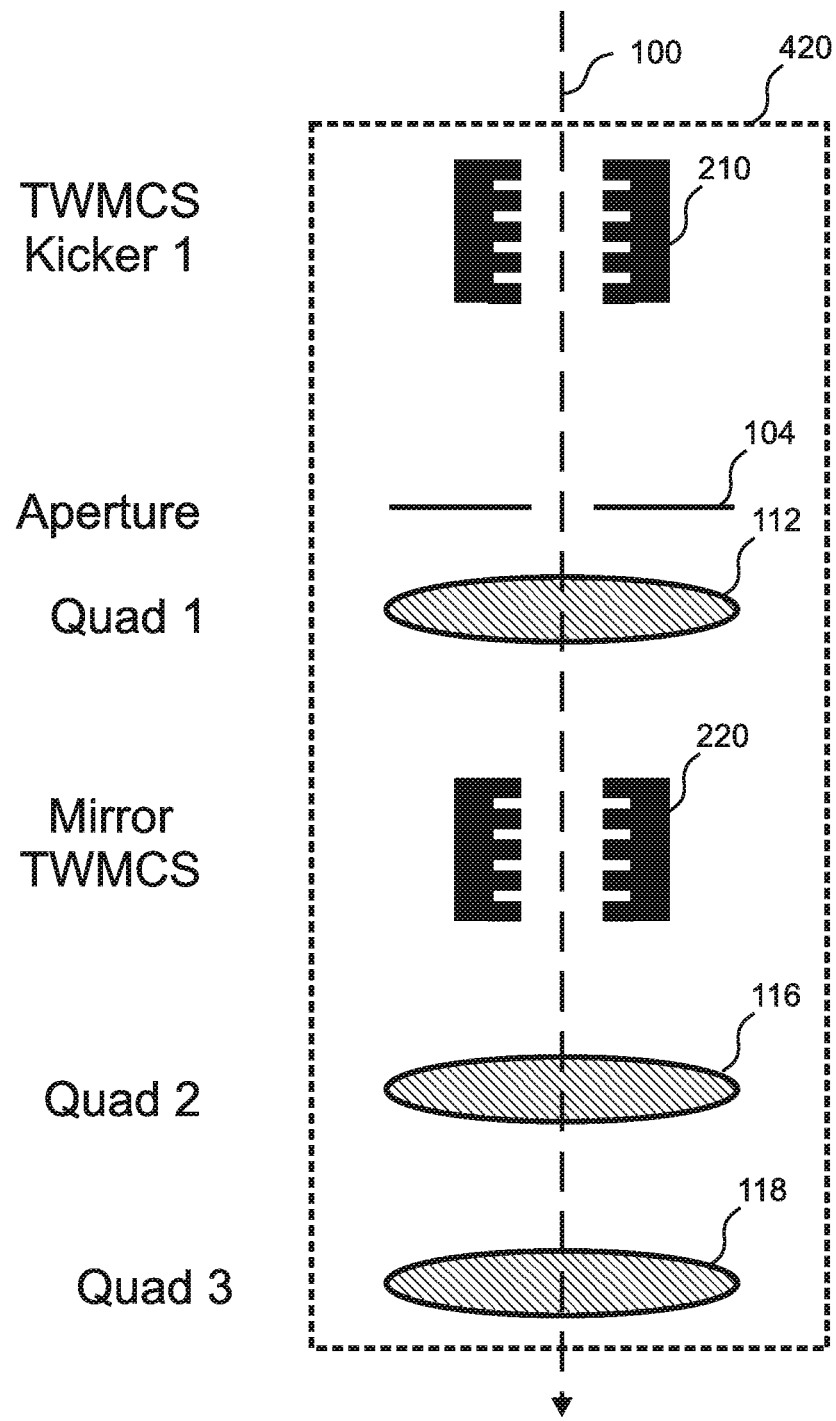
FIG. 4 is a block diagram of an embodiment that includes a demodulation section comprising a mirror demodulating TWMCS and three magnetic quadrupoles.

With reference to FIG. 4, embodiments of the present invention are configured in a similar manner to the TWC-EMMP illustrated in FIG. 1B, except that in the embodiment of FIG. 4 two metallic comb kickers 210 are included in place of the two TWC cavities 102 of FIG. 1B. The dimensions of the teeth 202 and the spacing between them, as well as the gap between the combs 200, are selected so as to achieve the following:

1) provide a required transverse kicking force to the electrons traversing the gap between two combs 200;
2) retard the RF wave phase velocity so that it matches the speed of the electrons; and
3) match the impendence of the transmission line 210 to a termination impedance (such as 50 ohms) so as to form a substantially pure traveling wave over a frequency range that is as wide as possible.

In various embodiments of the present invention, the outer surface of the TWMCS 210 can be any combination of a variety of low resistance metals, such as copper. The combs 200 of the TWMCS can be made entirely from the low resistance metal, or the comb can be made from another material and coated by the low resistance metal. For example, the combs can be made from solid aluminum to which a copper surface coating has been applied. Because electromagnetic waves of 100 MHz and above propagates only on the conducting surface "skins" of the TWMCS combs 200 (shallow "skin depth"), any material can be used for the interiors of the TWMCS combs 200, even for example 3D printed plastic, so long as the combs are coated with a low resistance metal. The low resistance coating can be applied, for example, by electroplating, atomic layer deposition (ALD), physical vapor deposition (PVD), chemical vapor deposition (CVD), sputtering, or molecular beam epitaxy (MBE). In some embodiments, the TWMCS 210 includes a metallic base material that is coated with a thin layer of a dissimilar metal so as to minimize vacuum outgassing.

With continuing reference to FIG. 4, in embodiments two TWMCS units 210, 220 are included in the TWMCS-EMMP device 420. The first TWMCS 210 is used as the kicker that modulates the DC electron beam 100 so that it can be chopped by the CCA aperture 104. The second TWMCS 220 is included in the dispersion suppressing section, and is used as a "mirror" TWMCS to suppress the transverse momentum and dispersion of the pulsed beam (beam artifacts) that results from the modulating action of the first TWMCS 210. The mirror kicker 220 suppresses these artifacts by means of applying transverse forces to the electrons at the same frequency and amplitude, but in an opposite direction, as compared to the kicker TWMCS 210. Both of the TWMCS devices 210, 220 are driven by an external RF source (not shown), which in embodiments operates over a broad frequency range, so that the repetition rate of electron pulses produced can be continuously adjusted over a very wide range. Embodiments include a phase shifter that can shift a relative phase of the RF applied to each of the TWMCS devices 210, 220. In embodiments, the RF source is also variable in amplitude, thereby enabling separate adjustment of the electron pulse duty cycle. In other embodiments, the two TWMCS devices 210, 220 are drive by separate RF sources that are phase-locked to each other, but can apply RF at different frequencies.

It should be noted that all elements of the TWMCS-EMMP 420 are enclosed within a vacuum chamber that is configured to provide a sufficiently high vacuum to enable electrons to pass through the TWMCS-EMMP 420 without significant attenuation due to residual gasses.

Figure 5B:
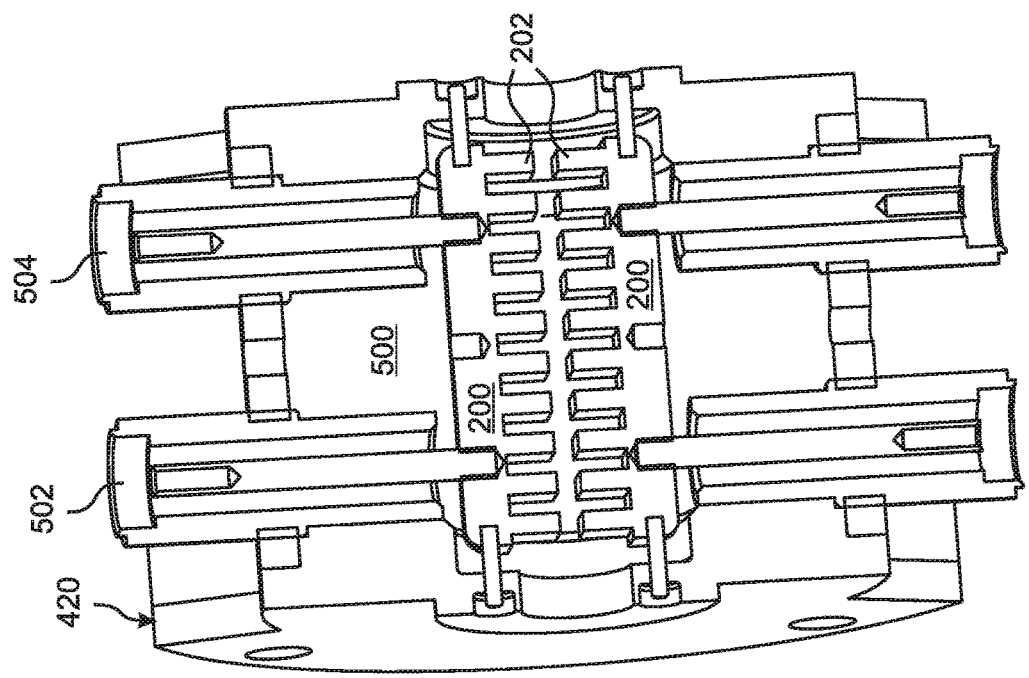
FIG. 5B is a sectional view showing the internal structure of the TWMCS of FIG. 5A.
Figure 5A:
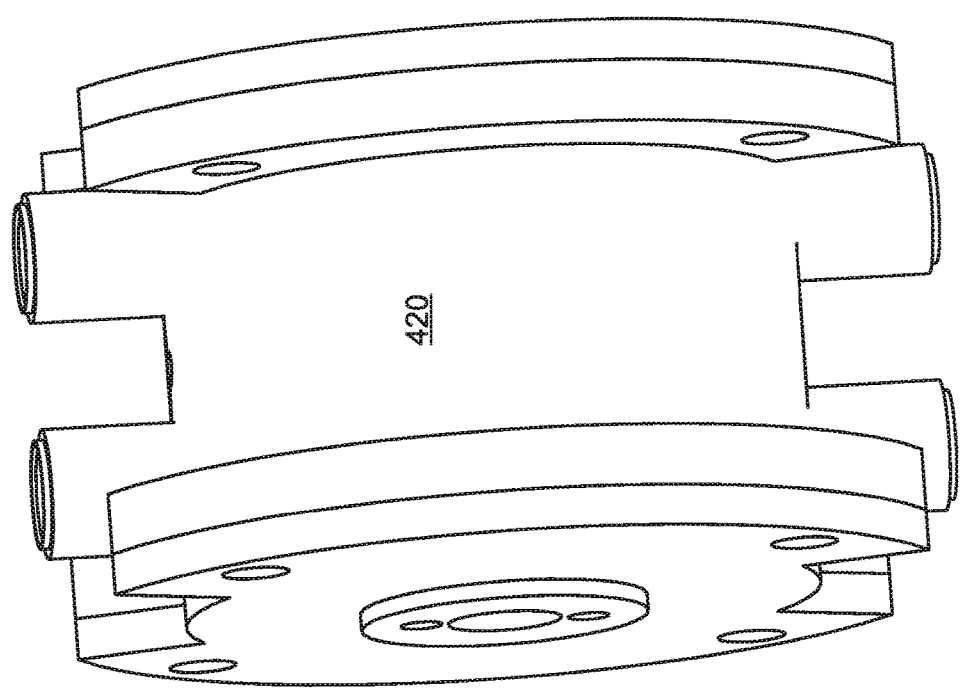
FIG. 5A is a side perspective view of a TWMCS in an embodiment of the present invention.

FIG. 5A is a perspective view of a TWMCS 210 in an embodiment of the present invention. FIG. 5B is a perspective sectional view of the embodiment of FIG. 5A taken along a central plane of the TWMCS 210. This more detailed view of the TWMCS 210 includes a vacuum chamber 500 that surrounds the combs 200 of the kicker 210, as well as a first vacuum feedthrough 502 at the proximal end through which the RF energy enters the TWMCS and a second vacuum feedthrough 504 at the distal end through which the traveling RF waves are terminated by a resistive load (not shown) or sent out as a feedback readout.

Figure 6:
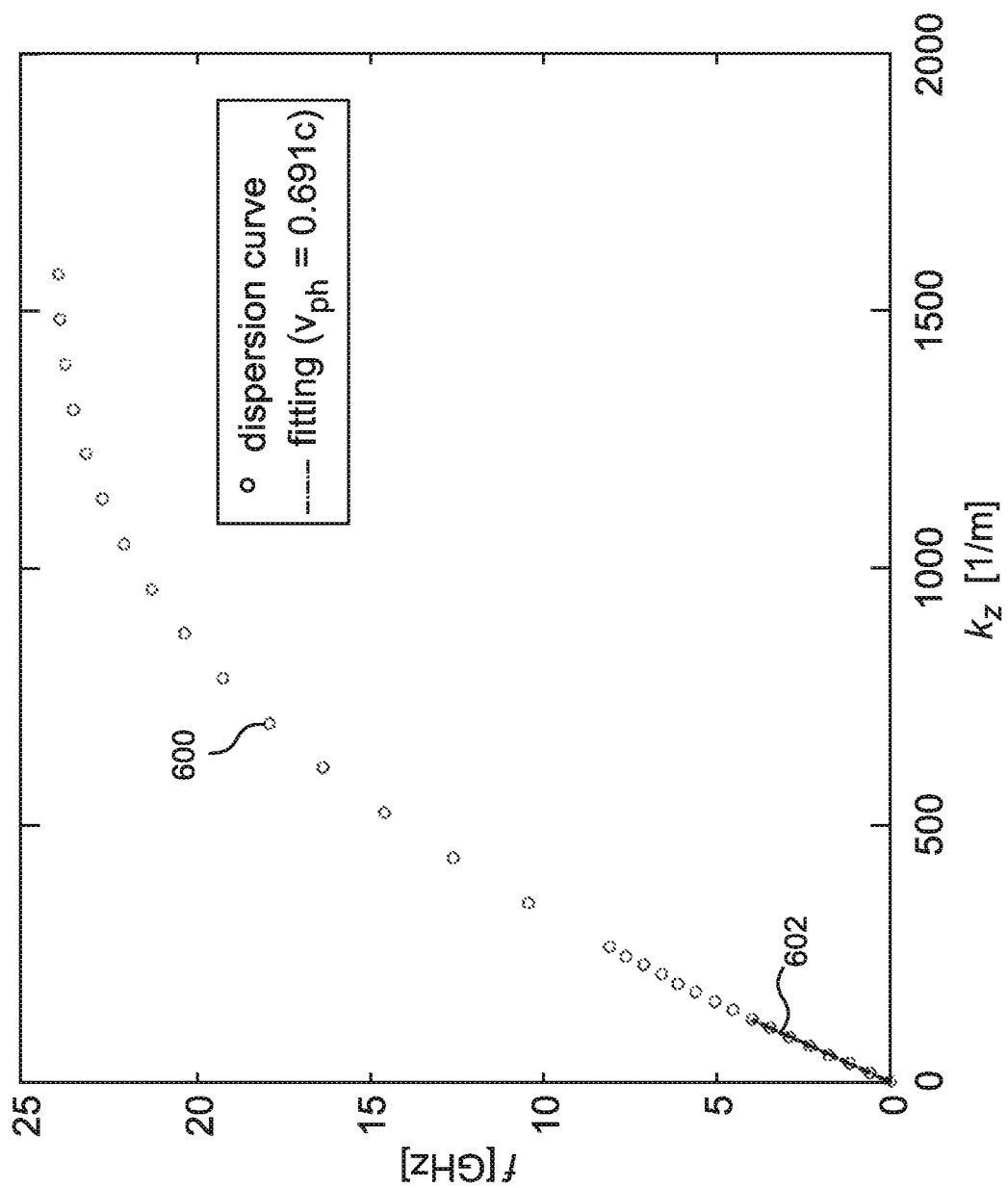
FIG. 6 is a graph of the phase velocity of electromagnetic waves propagating through a TWMCS in an embodiment of the present invention.

FIG. 6 is a graph that illustrates the dispersion curve (circles) 600 of an electromagnetic wave propagating through a TWMCS for which the phase velocity (slope of the dispersion curve) has been optimized to match a 200 keV input electron beam in an embodiment of the present invention. It can be seen from the figures that the phase velocity of the RF electromagnetic wave is matched to an electron kinetic energy of 200 keV electrons (dashed line in the lower left corner of the graph 602) for frequencies up to about 5 GHz. In the example shown in the figure, the phase velocity is $2.14 \times 10^8$ m/s, i.e. 69.1% of the speed of light, which corresponds to an electron beam kinetic energy of 200 keV.

Figure 7:
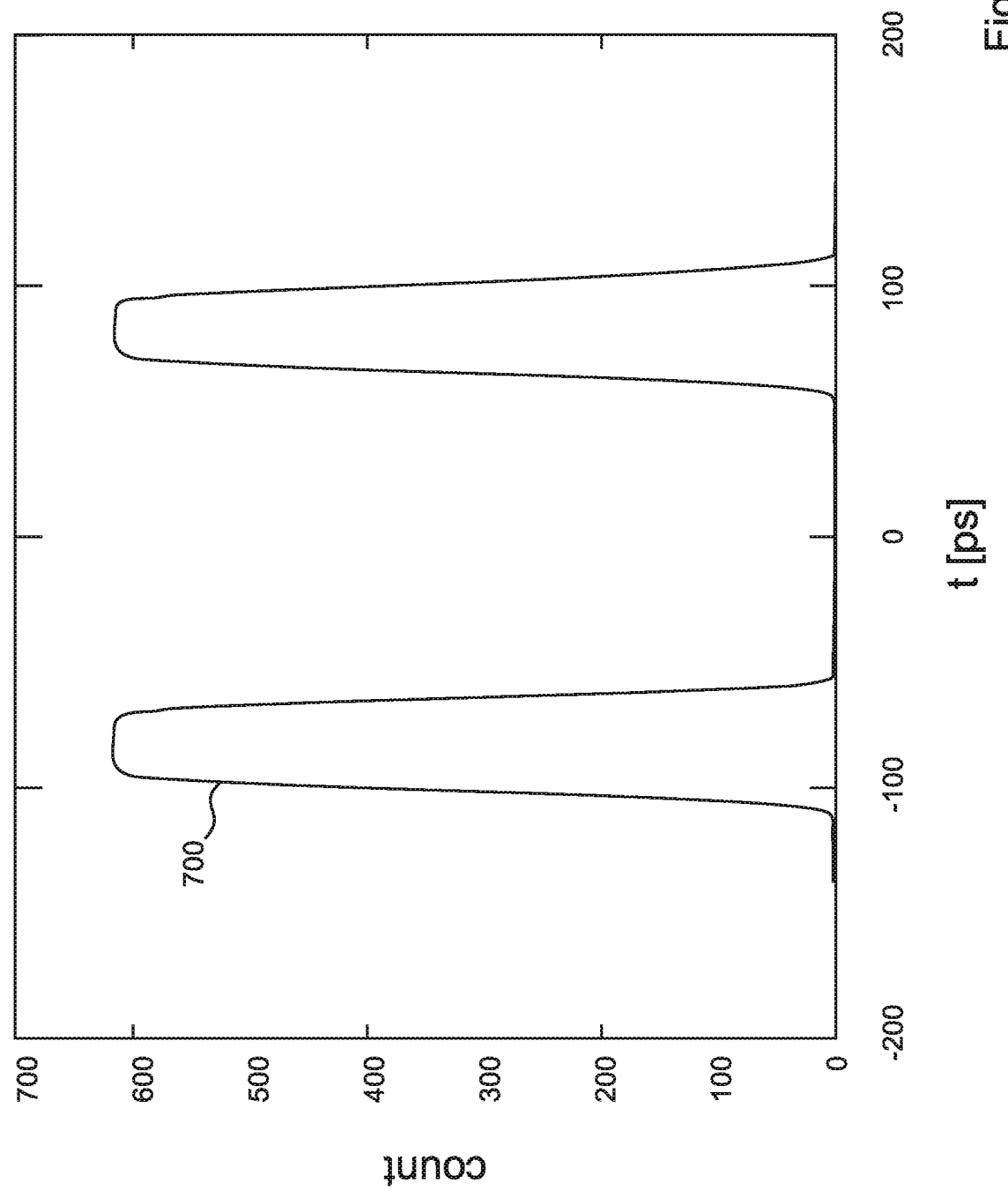
FIG. 7 is a graph that presents simulated results of the output current as a function of time for a TWMCS-EMMP in an embodiment of the present invention.

FIG. 7 is a graph that presents simulated results of the output current as a function of time for a TWMCS-EMMP in an embodiment of the present invention. The current amplitude 700 is presented in arbitrary units as a function of time, whereby the input continuous beam is constant, while the output beam is pulsed at a rate of 6 GHz, as determined by the frequencies of the RF (the CCA "chopping collimating aperture" is assumed to be fixed) that is applied to the TWMCS 210. The repetition rate of electron pulses is twice the frequency of the RF applied to the TWMCS, as described above.

Figure 8:
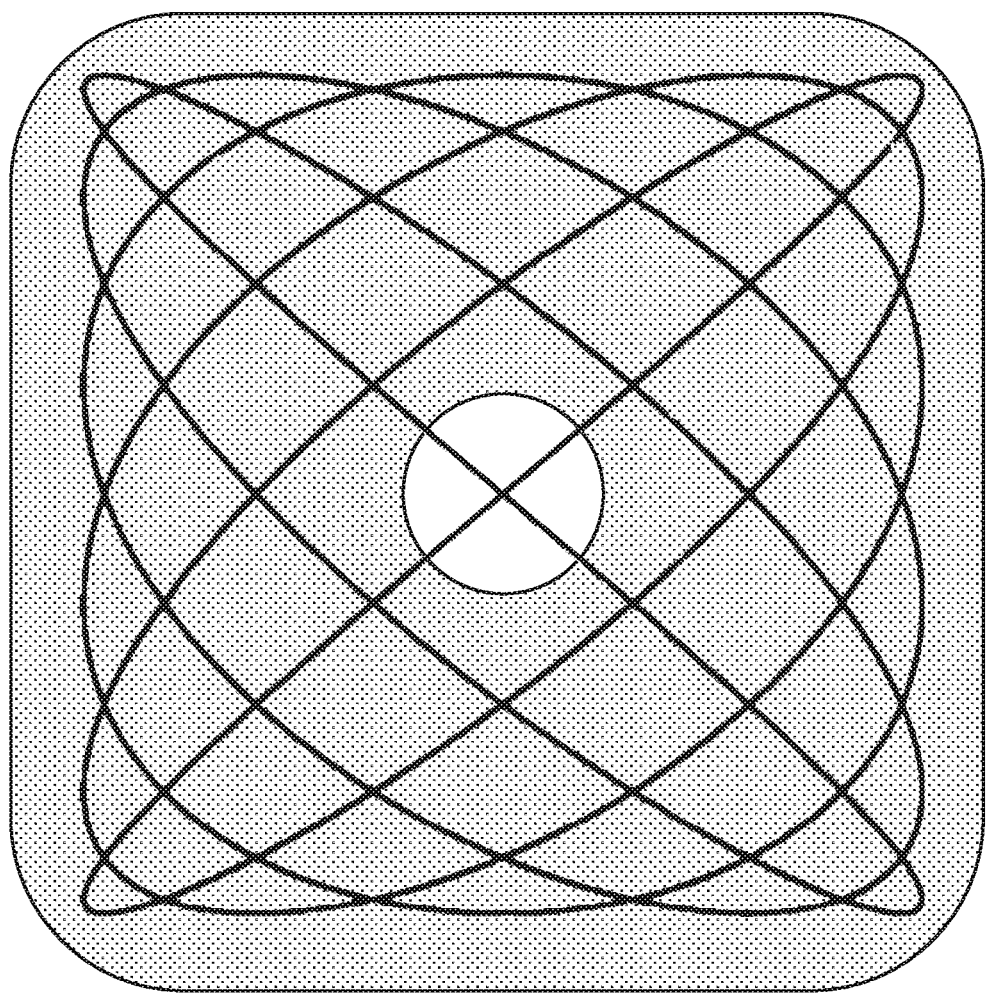
FIG. 8 presents a Lissajous pattern traced on the aperture plate in the embodiment of FIG. 2C where the drive frequencies of the two pairs of combs are phase-locked at a 4:3 frequency ratio.

FIG. 8 presents a Lissajous pattern traced over time onto the aperture plate 104 of a CCA 104 in an embodiment, wherein the TWMCS 210 includes two orthogonal pairs of combs 200, as shown in FIGS. 2C and 2D, and where the drive frequencies of the two pairs of combs 200 are not equal, but instead are phase-locked at a 4:3 frequency ratio. The resulting Lissajous pattern created on the CCA aperture plate 104 thereby results in a pulse train passing through the center opening of the CCA aperture 104 having a pulse repetition rate that is an integer fraction of the two drive frequencies. The broadband nature of the TWMCS in this Lissajous configuration allows selection of any integer ratio of drive frequencies, thereby enabling a continuously tunable range of pulse widths and pulse train frequencies to be independently selected.

Embodiments of the present invention are mechanically adjustable so as to provide further tuning capability to the pulser. In various embodiments, these features can include a CCA having an adjustable aperture. In its simplest form, the aperture 104 is a barrier that includes an opening through which electrons can pass when they are not deflected. The opening can be of any size, and of any shape, such as round, rectangular, or slit-shaped.

Figure 9B:
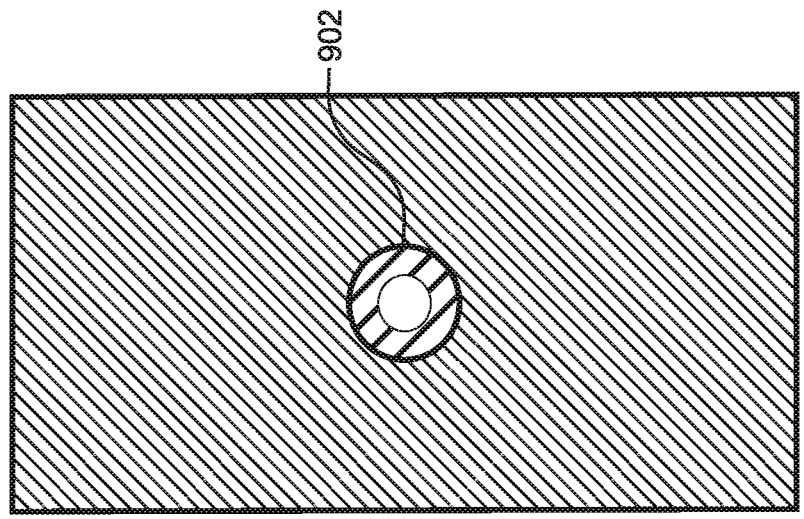
FIG. 9B is a rear view of the CCA of FIG. 9A.
Figure 9A:
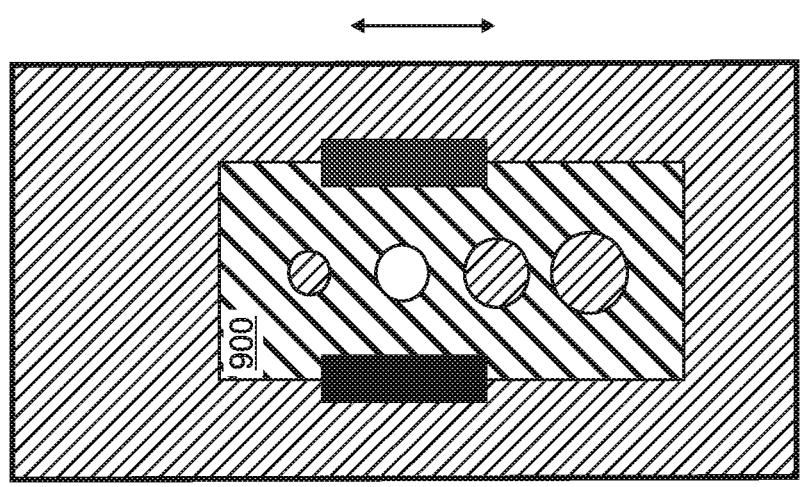
FIG. 9A is a front view of a CCA that includes a plate penetrated by a plurality of apertures of different sizes that is slidable so as to select a desired aperture size.

Embodiments of the present invention include more sophisticated apertures. For example, FIGS. 9A and 9B are front and rear views, respectively, of a CCA in an embodiment where the CCA includes a sliding strip 900 penetrated by a plurality of openings of different sizes. The strip 900 can be moved up and down so as to place a selected opening in front of a larger hole 902 provided in the underlying plate, thereby varying the size of the aperture.

Figure 10A:
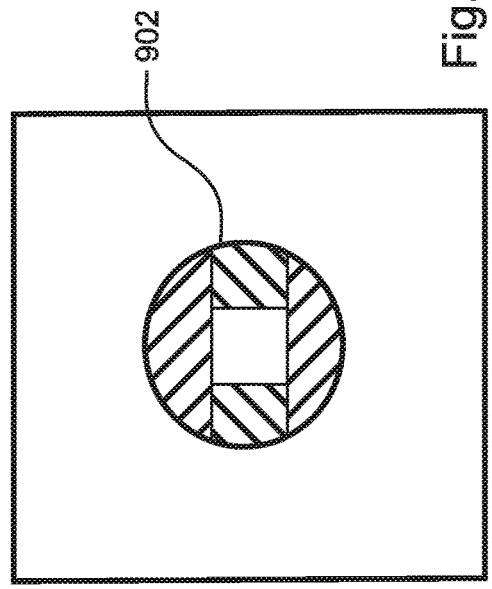
FIG. 10A is a front view of a CCA that includes a plurality of overlapping, slidable elements that can be used to adjust the aperture size of the CCA.
Figure 10B:
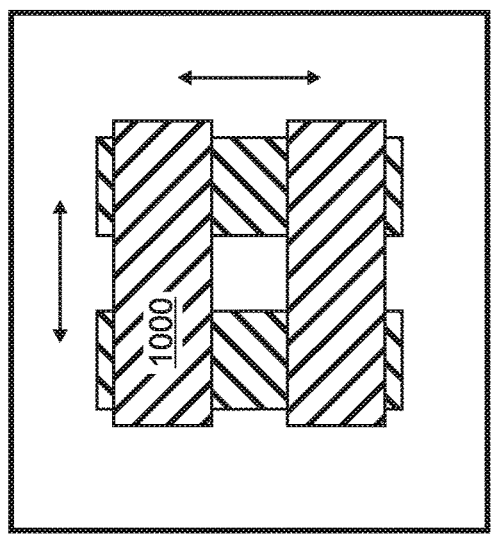
FIG. 10B is a rear view of the CCA of FIG. 10A.

FIGS. 10A and 10B are front and rear views, respectively, of a CCA that includes two orthogonal pair of sliding panels 1000 that are positioned over the large opening 902 in the CCA plate and can be moved toward and away from each other so as to continuously vary the size of the aperture. In similar embodiment, only a single pair of sliding panels 1000 is provided, such that the aperture is shaped as a slit. In some of these embodiments, adjusting a relative degree of deflection of the electron beam in the vertical and horizontal directions, for example as indicated in FIG. 8, results in adjustment of the pulse widths for a given aperture slit width. In some of these embodiments the panels 1000 are electrically isolated from the remainder of the EMMP, such that the CCA 104 can be used as a beam current monitor and/or as a beam position monitor.

Figure 11A:
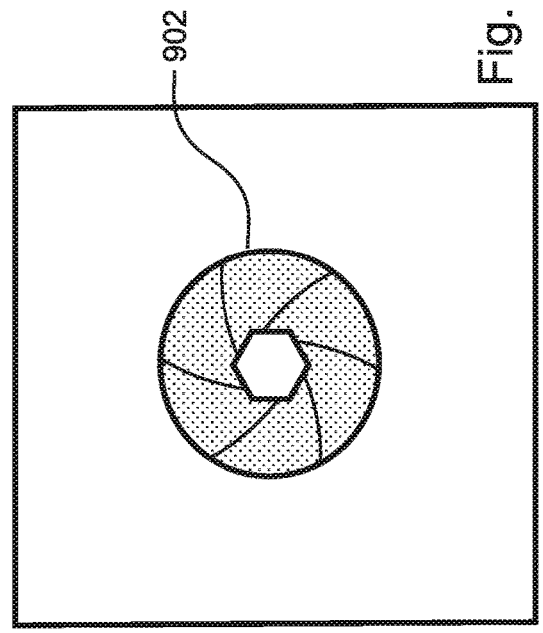
FIG. 11A is a front view of a CCA that includes an iris that can be mechanically actuated so as to adjust the aperture size.
Figure 11B:
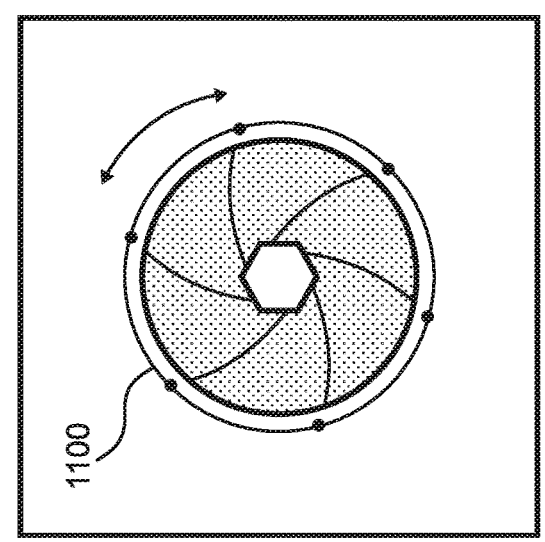
FIG. 11B is a rear view of the CCA of FIG. 11A.

FIGS. 11A and 11B are front and rear views, respectively, of a CCA that includes an iris 1100 that can be rotated to provide a continuously variable aperture.

Figure 12A:
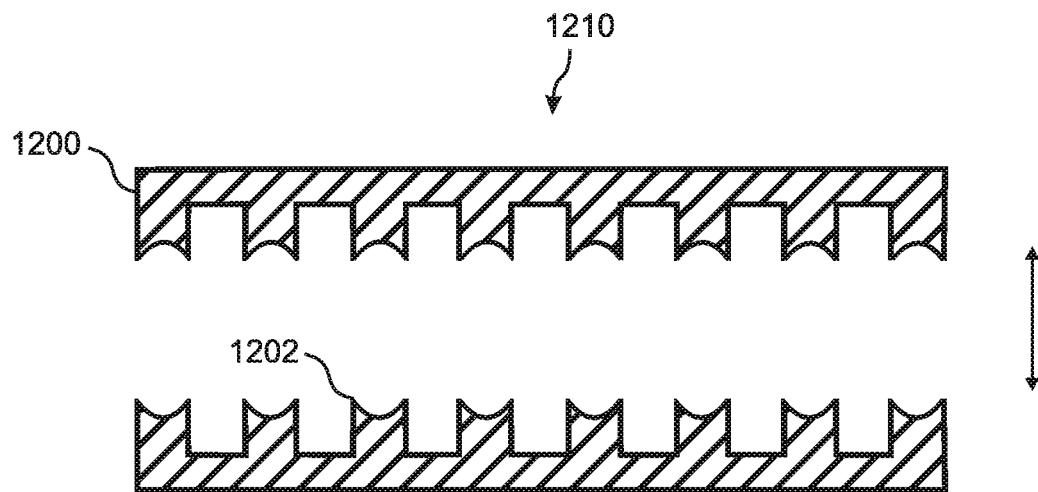
FIG. 12A is a side view of a TWMCS having combs that are adjustable in their relative latitudinal offsets.

With reference to FIG. 12A, in some embodiments at least one of the combs 1200 of the TWMCS 1210 can be shifted in position relative to the other, for example by a mechanical actuator, so as to vary the space between the combs, thereby enabling the traveling wave phase velocity to be tuned so as to match a variable kinetic energy of the input electrons 204, for example over a kinetic energy range of +/−500 keV. Embodiments combine this feature with combs 1200 having teeth 1202 that are stepped or shaped as smoothly tapered triangles in cross section, so that adjustment of the gap between the combs 1200 effectively adjusts the depth of the teeth 1202 that is presented to the traveling wave.

Figure 12B:
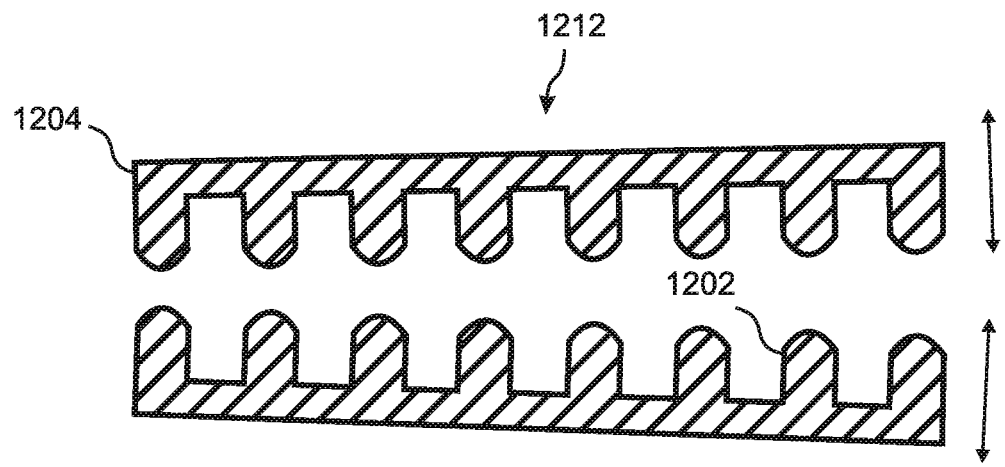
FIG. 12B is a side view of a TWMCS having combs that are adjustable in their relative orientations.

Similarly, as illustrated in FIG. 12B, in embodiments the combs 1204 of the TWMCS 1212 are not parallel. In some of these embodiments, the combs 1204 are variable in orientation, so that the angle formed between the two combs 1204, and thereby the width of the passage between the combs 1204, is variable so as to excite special electromagnetic wave modes and implement special beam modulation patterns. In embodiments, the teeth 1202 are not rectangular, but can be concave (as shown in FIG. 12A), convex (as shown in FIG. 12B), pointed, beveled, or shaped in any way that provides a desired effect on the propagating RF wave. Also, the cross sectional shapes of the combs 200 transverse to the beam direction can be any shape as best suits a given application.

Figure 13:
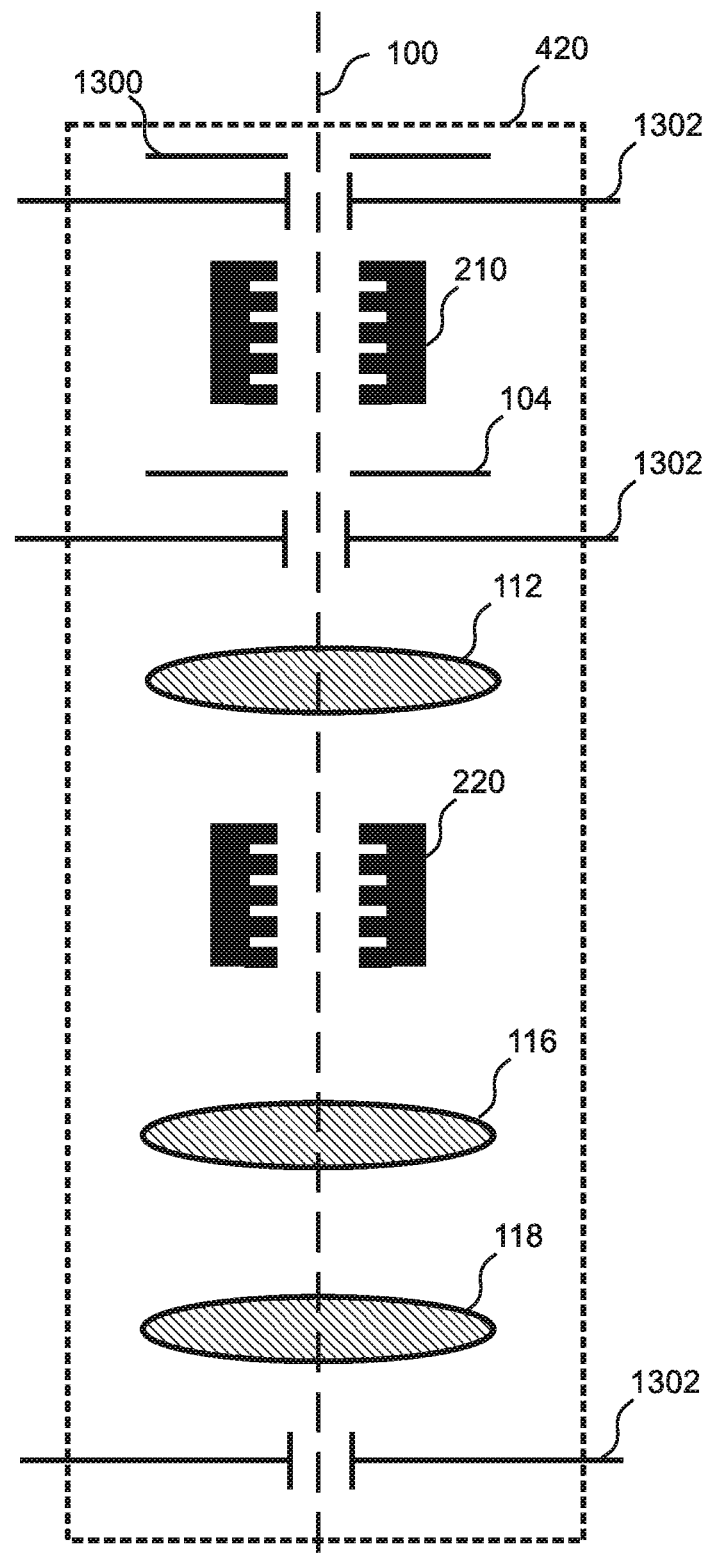
FIG. 13 is a block diagram of a TWMCS-EMMP that includes beam steering devices in various locations.

With reference to FIG. 13, embodiments further include one or more additional apertures 1300 that can be located, for example, at the electron beam input to the kicker 210. Some embodiments include one or more magnetic or electrostatic beam steering features 1302, which can be located for example at the input to the TWMCS kicker 210, at the output of the CCA 104, and/or at the output of the pulser 420.

With reference to FIG. 14, some embodiments further include a "down-selecting" TWMCS 1400 and down-selecting aperture 1402 located downstream of the CCA 104. For simplicity of illustration, the artifact suppressing elements of the EMMP such as a mirror kicker 220 and quadrupoles 112, 116, 118 are not included in the figure. In the illustrated embodiment, the first kicker 210 is excited by RF at a first RF frequency F1, and the aperture 104 converts the transversely modulated beam into a pulsed beam as described above. The down-selecting kicker 1400 is excited by RF at a second RF frequency F2 that is a sub-harmonic of F1, i.e. F1/F2=an integer. As a result, the down-selecting kicker 1400 deflects some of the electron pulses out of the beam so that they are blocked by the down-selecting aperture 1402, thereby reducing the number of pulses that remain, such that the pulse widths are narrow, as determined by the TWMCS kicker 210 and CCA 104, while the pulse repetition rate is slow, as determined by the down-selecting TWMCS 1400.

Figure 14A:
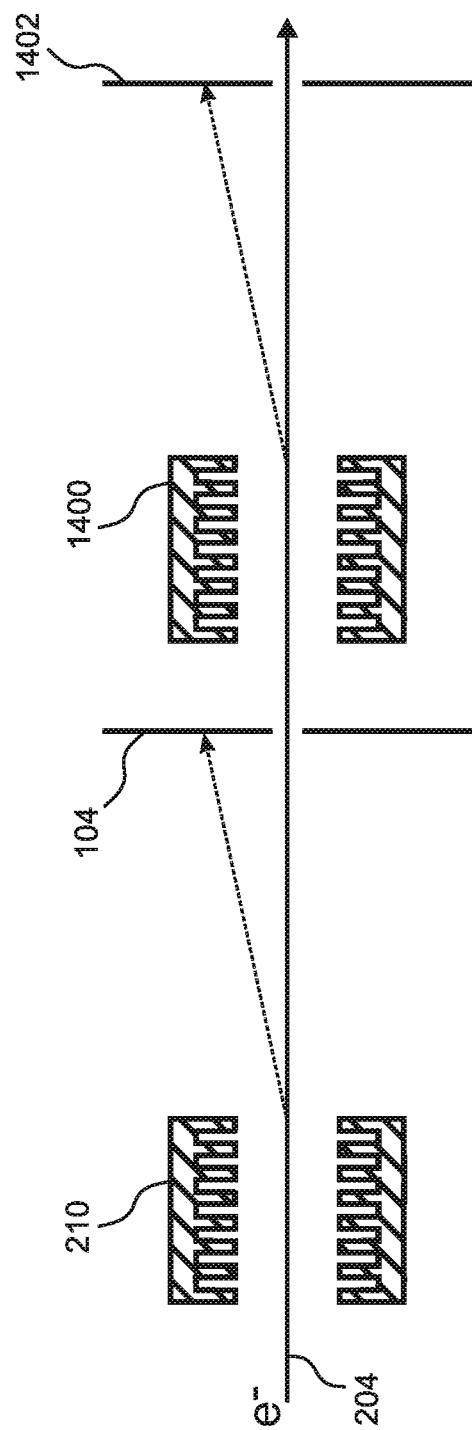
FIG. 14A is a simplified diagram of an embodiment of the present invention that includes a "down-selecting" TWMCS and aperture.
Figure 14B:
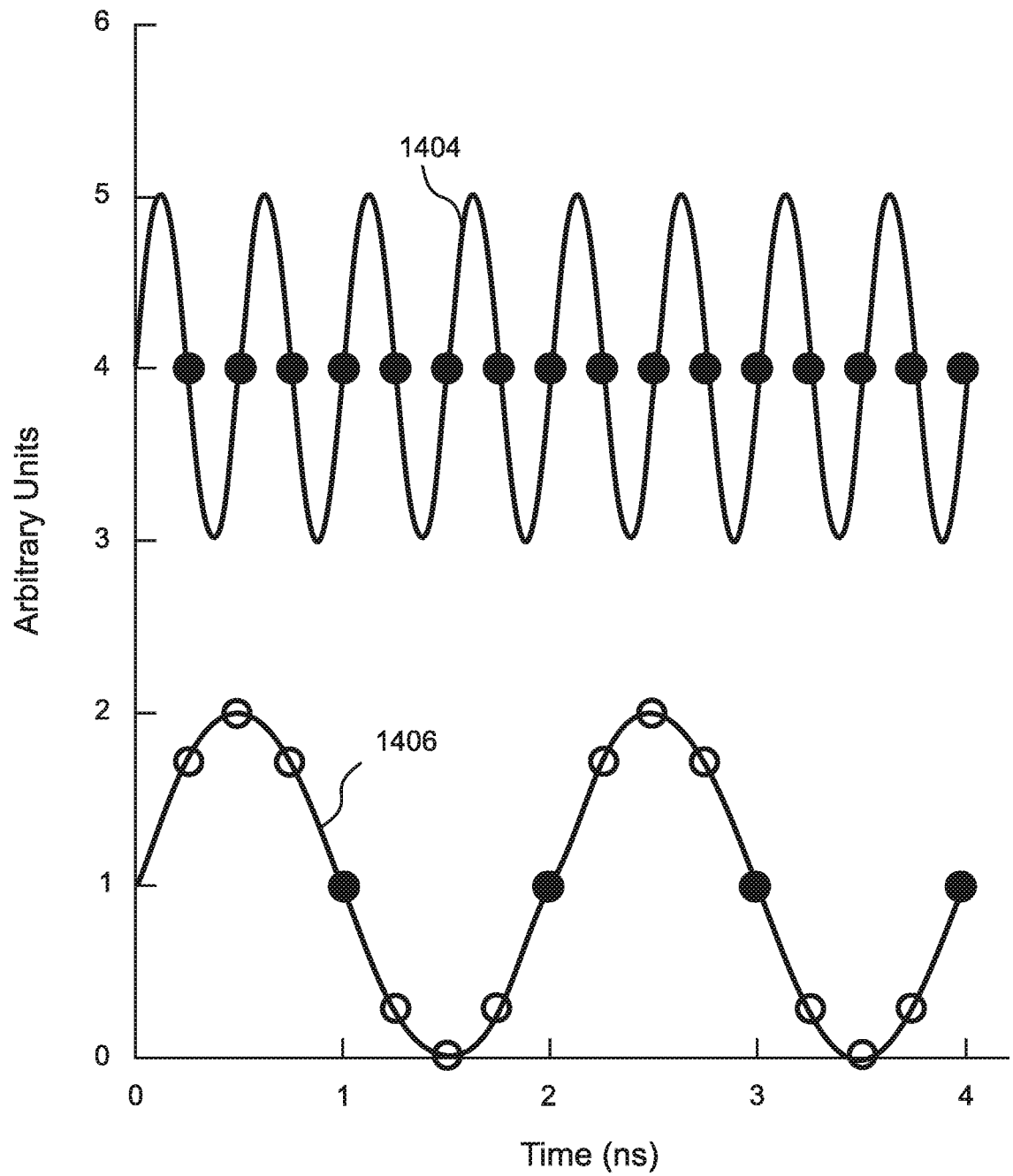
FIG. 14B presents two curves that illustrate the function of the two kickers in the embodiment of FIG. 14A.

FIG. 14B presents two curves 1404, 1406 that illustrate the function of the two kickers 210, 1400 and associated apertures 104, 1402 in the embodiment of FIG. 14A. In the illustrated embodiment, F1/F2=4. For example, if F1=2 GHz, then the first kicker 210 and aperture 104 will chop the incoming electron beam 204 into a 4 GHz pulse train (solid circles in curve 1404). And if a phase-locked sub-harmonic waveform is applied at 500 MHz to the down-selecting TWMCS 1400, then the electron pulses will passes undisturbed through the down-selecting TWMCS 1400 and aperture 1402 when the RF within the down-selecting TWMCS 1400 is at a "zero-crossing," as shown by the solid circles in the lower curve 1406. However, when the RF waveform in the down-selecting TWMCS 1400 has nonzero amplitude, then the electron pulses will be transversely deflected out of the beam and will be blocked by the down-selecting aperture 1402, as indicated by the open circles in the lower curve 1406 of FIG. 14B. The result will be a down-selected pulse train, downstream of the down-selecting TWMCS 1400, having a repetition rate that is an integer fraction of the pulse repetition rate of the beam as it emerges from the aperture 104, but having the short pulse widths that result from the higher RF F1 frequency that is applied to the TWMCS kicker 210. Accordingly, FIGS. 14A and 14B illustrate an embodiment that can be used to generate pulsed beams having low repetition rates combined with short pulse lengths.

For example, if the pulses generated by the first kicker 210 and the aperture 104, when excited at 2 GHz, and depending on the dimensions of the aperture 104, are 10 ps in width, and if RF is applied at 500 MHz to the down-selecting TWMCS 1400, then the result will be a 1 GHz "down-selected" pulse train of 10 ps pulses, as compared to the 4 GHz pulse train that would result if the down-selecting TWMCS 1400 were not present.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application.

This specification is not intended to be exhaustive. Although the present application is shown in a limited number of forms, the scope of the invention is not limited to just these forms, but is amenable to various changes and modifications without departing from the spirit thereof. One or ordinary skill in the art should appreciate after learning the teachings related to the claimed subject matter contained in the foregoing description that many modifications and variations are possible in light of this disclosure. Accordingly, the claimed subject matter includes any combination of the above-described elements in all possible variations thereof, unless otherwise indicated herein or otherwise clearly contradicted by context. In particular, the limitations presented in dependent claims below can be combined with their corresponding independent claims in any number and in any order without departing from the scope of this disclosure, unless the dependent claims are logically incompatible with each other.

We claim:

1. An ElectroMagnetic Mechanical Pulser ("EMMP") comprising:
   an input configured to accept a continuous input electron beam;
   a Traveling Wave Metallic Comb Stripline kicker ("TWMCS" kicker) located downstream of the input and having an internal passage through which the electron beam passes, the TWMCS kicker being configured to impose an oscillatory transverse deflection on the electron beam according to at least one of a transverse time-varying electric field and a transverse time-varying magnetic field generated within the TWMCS kicker by a first RF traveling wave propagated through the TWMCS kicker;
   a Chopping Collimating Aperture ("CCA") located downstream of the TWMCS kicker and configured to block the electron beam when its deflection exceeds a threshold maximum or minimum, thereby chopping the electron beam into a chopped stream of electron pulses having an electron pulse repetition rate and duty cycle;
   an output configured to allow electron pulses to emerge from the EMMP as an output stream of electron pulses having a pulse repetition rate and a pulse duty cycle; and
   a vacuum chamber surrounding all elements of the EMMP and configured to provide a vacuum that is sufficient to allow the electron beam to pass through the EMMP without significant attenuation thereof by residual gasses, wherein:
      the TWMCS kicker includes at least one pair of opposing combs;
      each of said opposing combs of said pair of combs comprises a strip from which a plurality of substantially identical, equally spaced-apart blocks extend as teeth;
      the combs of the pair of combs are spaced apart with teeth facing inward such that the internal passage through which the electron beam passes is between the teeth of the pair of combs;
      the pair of combs includes an RF energy input proximal to a first end thereof and an RF energy output proximal to an opposite, second end thereof;
      the teeth of the pair of combs are configured to control a phase velocity of a traveling RF wave propagating from the first end to the second end so that it is matched to an electron velocity of the electron beam; and
      all exposed surfaces of the pair of combs are electrically conductive.

2. The EMMP of claim 1, further comprising a dispersion suppressing section downstream of the CCA, the dispersion suppressing section being configured to suppress a residual dispersion of the stream of electron pulses arising from the deflection imposed by the TWMCS kicker.

3. The EMMP of claim 2, wherein the dispersion suppressing section includes a demodulating mirror TWMCS having an internal passage through which the electron beam passes downstream of the CCA the mirror TWMCS having a physical configuration that causes a phase velocity of a second RF traveling wave propagated through the mirror TWMCS to be matched to a velocity of the electron beam, the mirror TWMCS being configured to demodulate the oscillatory transverse deflection imposed on the electron beam by the TWMCS kicker.

4. The EMMP of claim 2, wherein the dispersion suppressing section includes at least one magnetic quadrupole.

5. The EMMP of claim 1, wherein the pulse repetition rate of the electron pulses in the output stream is tunable from 0.1 GHz to 20 GHz.

6. The EMMP of claim 1, wherein a pulse length of the electron pulses in the output stream is tunable from 100 fs to 10 ps.

7. The EMMP of claim 1, wherein the duty cycle of the electron pulses in the output stream is tunable from 1% to 10%.

8. The EMMP of claim 1, wherein the pulse repetition rate and the duty cycle of the electron pulses in the output stream are independently tunable.

9. The EMMP of claim 1, wherein the EMMP is configured to accept input electron beams having a kinetic energy between 100 and 500 keV.

10. The EMMP of claim 1, wherein the TWMCS kicker includes two pair of opposing combs through which the electron beam simultaneously passes, the two pair of opposing combs being arranged such that a first pair thereof deflects the electron beam in a first deflection plane and a second pair thereof deflects the electrons in a second deflection plane that is orthogonal to the first deflection plane, wherein a line of intersection between the first and second deflection planes lies along the internal passage through which the electron beam passes.

11. The EMMP of claim 1, wherein the EMMP further comprises a down-selecting TWMCS positioned downstream of the CCA and configured to reduce the pulse repetition rate of the output stream by deflecting some pulses out from the chopped stream of electron pulses that emerges from the CCA.

12. The EMMP of claim 11, wherein the EMMP further includes a down-selecting aperture located downstream of the down-selecting TWMCS.

13. The EMMP of claim 1, wherein at least one of the combs of the pair of combs can be laterally shifted toward and away from the other of the combs of the pair of combs.

14. The EMMP of claim 1, wherein the RF energy output is connected to a terminating impedance.

15. The EMMP of claim 14, wherein the terminating impedance is a 50 Ohm impedance.

16. The EMMP of claim 1, wherein an orientation of at least one of the combs of the pair of combs can be varied in orientation so as to adjust an angle between the pair of combs.

17. The EMMP of claim 1, wherein an aperture size of the CCA is mechanically adjustable.

18. The EMMP of claim 1, wherein the CCA includes an aperture that is not circular.

19. The EMMP of claim 18, wherein the CCA includes an elongated aperture having a height thereof that is at least twice as large as a width thereof.

20. The EMMP of claim 1, wherein the EMMP includes an aperture having electrically isolated elements that enable the aperture to function as at least one of a beam position monitor and a beam current monitor.

21. The EMMP of claim 1, further comprising at least one magnetic or electrostatic beam deflecting element that is configured to adjust a propagating direction of the electron beam.

22. A method of generating electron pulses, the method comprising:
providing an EMMP according to claim 1;
causing a continuous electron beam to pass through the TWMCS kicker while applying RF energy to the RF energy input of the TWMCS kicker, said RF energy causing a traveling RF wave to propagate through the TWMCS kicker, said traveling RF wave having a phase velocity that is substantially equal to an electron velocity of the electron beam, thereby imposing a spatial oscillation on the continuous electron beam;
causing the spatially oscillating electron beam to impact the CCA, so that the CCA blocks the electron beam when its deflection exceeds a threshold maximum or minimum, thereby chopping the electron beam into a stream of electron pulses having a desired electron pulse repetition rate;
adjusting an amplitude of the applied RF energy so as to adjust widths of the electron pulses to be equal to a desired electron pulse width; and
adjusting a frequency of the applied RF energy so that it is equal to one half of a desired electron pulse repetition rate.

23. The method of claim 22, wherein the desired electron pulse repetition rate is between 100 MHz and 50 GHz, and the desired electron pulse width is in a range 100 fs to 10 ps.

24. The method of claim 22, wherein the specified electron pulse energy is between 100 keV and 500 keV.

25. The method of claim 22, wherein the TWMCS kicker includes two orthogonal pairs of combs, and wherein the method further comprises applying RF energy to a first of the pairs of combs at a first frequency and applying RF energy to a second of the pairs of combs at a second frequency.

26. The method of claim 22, wherein:
the TWMCS kicker includes two orthogonal pairs of combs;
the CCA includes an aperture opening having a non-circular shape: and
the method further comprises applying RF energy to a first of the pairs of combs at a first RF amplitude and applying RF energy to a second of the pairs of combs at a second RF amplitude, and varying the electron pulse width by varying a difference between the first and second RF amplitudes.

27. The method of claim 22, wherein the EMMP further comprises a down-selecting TWMCS positioned downstream of the CCA, and the method further comprises applying RF energy at a first RF frequency F1 to the TWMCS kicker and applying RF energy to the down-selecting TWMCS at a second RF frequency F2, wherein either F1/F2 or F2/F1 is an integer.

28. The method of claim 27, wherein the EMMP further comprises a down-selecting aperture downstream of the down-selecting TWMCS.

29. The method of claim 28, wherein the down selecting aperture includes an opening having a height thereof that is at least twice as large as a width thereof.

* * * * *

UNITED STATES PATENT AND TRADEMARK OFFICE
CERTIFICATE OF CORRECTION

PATENT NO. : 10,515,733 B1
APPLICATION NO. : 16/393469
DATED : December 24, 2019
INVENTOR(S) : Chunguang Jing et al.

It is certified that error appears in the above-identified patent and that said Letters Patent is hereby corrected as shown below:

In the Specification

Column 2, Line 58: 108 m/s should be $10^8$ m/s

Column 8, Line 61: comprises should be comprise

Column 14, Line 25: embodiment should be embodiments

Column 15, Line 5: Fig. 14 should be Fig. 14A

Column 15, Line 31: passes should be pass

Column 16, Line 3: or ordinary should be of ordinary

In the Claims

Column 17, Line 32: in Claim 10, pair should be pairs

Column 17, Line 33: in Claim 10, pair should be pairs

Signed and Sealed this
Thirteenth Day of September, 2022

*Katherine Kelly Vidal*

Katherine Kelly Vidal
*Director of the United States Patent and Trademark Office*